United States Patent
Igarashi et al.

(10) Patent No.: US 6,813,756 B2
(45) Date of Patent: Nov. 2, 2004

(54) METHOD OF AUTOMATIC LAYOUT DESIGN FOR LSI, MASK SET AND SEMICONDUCTOR INTEGRATED CIRCUIT MANUFACTURED BY AUTOMATIC LAYOUT DESIGN METHOD, AND RECORDING MEDIUM STORING AUTOMATIC LAYOUT DESIGN PROGRAM

(75) Inventors: Mutsunori Igarashi, Kanagawa-ken (JP); Masami Murakata, Kanagawa-ken (JP); Takashi Mitsuhashi, Kanagawa-ken (JP); Masaaki Yamada, Kanagawa-ken (JP); Fumihiro Minami, Kanagawa-ken (JP); Takashi Ishioka, Kanagawa-ken (JP)

(73) Assignee: Kabushiki Kaisha Toshiba (JP)

(*) Notice: Subject to any disclaimer, the term of this patent is extended or adjusted under 35 U.S.C. 154(b) by 0 days.

(21) Appl. No.: 10/279,403

(22) Filed: Oct. 24, 2002

(65) Prior Publication Data

US 2003/0079194 A1 Apr. 24, 2003

Related U.S. Application Data

(62) Division of application No. 09/713,050, filed on Nov. 15, 2000, now Pat. No. 6,546,540.

(30) Foreign Application Priority Data

Nov. 17, 1999 (JP) .......................................... P11-327370

(51) Int. Cl.[7] .............................................. G06F 17/50
(52) U.S. Cl. ........................ 716/14; 438/617; 257/723; 257/758; 716/6; 716/8; 716/15; 716/19
(58) Field of Search ................................ 257/723, 758, 257/210; 438/617; 716/6, 8, 14, 15, 19, 1, 2, 9, 20, 21

(56) References Cited

U.S. PATENT DOCUMENTS

| | | | |
|---|---|---|---|
| 5,117,277 A | | 5/1992 | Yuyama et al. ............. 257/210 |
| 5,332,922 A | * | 7/1994 | Oguchi et al. ............... 257/723 |
| 6,128,767 A | * | 10/2000 | Chapman ......................... 716/1 |
| 6,301,686 B1 | | 10/2001 | Kikuchi et al. ................ 716/2 |
| 6,385,758 B1 | | 5/2002 | Kikuchi et al. ................ 716/2 |

FOREIGN PATENT DOCUMENTS

| | | |
|---|---|---|
| JP | 07-086414 | 3/1995 |
| JP | 09-153083 | 6/1997 |

* cited by examiner

*Primary Examiner*—Thuan Do
(74) *Attorney, Agent, or Firm*—Gray Cary Ware & Freidenrich LLP

(57) ABSTRACT

With an automatic layout method, a first line having a first line width is generated in a prescribed direction. A second line having a second line width and extending at an oblique angle with respect to the first line is generated, so that the second line terminates at an end portion of the first line with an overlapped area. One or more VIA patterns are read out of a database according to the shape of the overlapped area. The VIA patterns are placed in the overlapped area, so that one of the VIA patterns is located at the intersection of the center lines of the first and second lines. The VIA pattern is a combination of parallelograms, including squares and rectangles.

19 Claims, 26 Drawing Sheets

TOP METAL OVERHANG

BOTTOM METAL OVERHANG

TOP METAL OVERHANG
BOTTOM METAL OVERHANG

EXPOSURE USING MASK 75C

METHOD OF AUTOMATIC LAYOUT DESIGN FOR LSI, MASK SET AND SEMICONDUCTOR INTEGRATED CIRCUIT MANUFACTURED BY AUTOMATIC LAYOUT DESIGN METHOD, AND RECORDING MEDIUM STORING AUTOMATIC LAYOUT DESIGN PROGRAM

CROSS-REFERENCE TO RELATED APPLICATIONS

This application is a divisional application and claims the benefit of U.S. patent application Ser. No. 09/713,050 filed on Nov. 15, 2000 U.S. Pat. No. 6,546,540, the disclosure of which is incorporated herein by reference.

The present patent application claims the benefit of earlier Japanese Patent Application No. H11-327370 filed Nov. 17, 1999, the disclosure of which is entirely incorporated herein by reference.

BACKGROUND OF THE INVENTION

1. Field of the Invention

This invention relates to a technique of automatic layout design applied to CAD for placement and routing. The invention also relates to a mask set and a semiconductor integrated circuit manufactured by the automatic layout design technique, and to a recording medium storing the automatic layout program.

2. Description of the Related Art

Along with the progress of LSI technologies, the circuit scale becomes larger and larger, and consequently, which causes increase of an amount of logical design computation. Such logical design is carried out making use of computers, which is known as CAD (Computer Aided Design).

In designing interconnection of basic horizontal and vertical lines in the orthogonal coordinate system on CAD, horizontal and vertical lines often terminate at an intersection of two or more orthogonal lines. If the horizontal lines and the vertical lines are formed in different layers in an actual semiconductor device, a via hole must be formed at the terminal portions of the metal lines to connect the horizontal and vertical lines three-dimensionally. Accordingly, a connection pattern corresponds to the via hole must be defined at a terminal of horizontal and vertical lines on CAD.

In general, if two basic orthogonal lines having an ordinary width W terminate at an intersection, terminal processing is carried out to extend the ends of the orthogonal lines by W/2.

FIG. 1 shows an example of terminal processing of the basic orthogonal lines of the minimum width. In FIG. 26A, a horizontal line 801 and a vertical line 803 meet each other at a terminal. In a CAD system, only the intersection point at which the center lines 802 and 804 of the respective lines cross each other is recognized as an intersection 808. The CAD does not recognize the overlap of two orthogonal lines at all.

If, in an actual semiconductor device, the horizontal line 801 is formed in a lower layer and the vertical line 802 is formed in an upper layer, these two lines must be connected three-dimensionally by a via contact. In this case, the CAD layout requires a connection pattern 805 (FIG. 1C) at the intersection of the two orthogonal lines 801 and 803. The connection pattern 805 consists of a bottom metal 801a, which is a part of the end portion of the line 801, a top metal 803a, which is a part of the end portion of the line 803, and an opening 807 (hereinafter, referred to as a "cut") for connecting the top and bottom metals 803a and 801a.

In an example shown in FIG. 1, the CAD recognizes two lines crossing each other, and accordingly, it is possible to define the connection pattern 805 at the intersection recognized by the CAD. However, if the two lines terminate in the state shown in FIG. 1A, the overlapped area between the horizontal line 801 and the vertical line 803 is very small. If a via hole is formed in an actual integrated circuit based on the layout shown in FIG. 1A, the lines of the upper and lower layers can not be reliably connected.

To overcome this problem, the ends of the horizontal and vertical lines 801 and 803 are extended by W/2, as shown in FIG. 1B, so that the end portion of the vertical line 803 lies completely on top of the end portion of the horizontal line 801. Then, the connection pattern 805 is placed on the overlapped area.

FIG. 1C illustrates a connection pattern 805 and a side view of a via hole formed in an actual integrated circuit. The connection pattern 805 is square because it is placed at the intersection of two basic orthogonal lines.

FIG. 2 illustrates another conventional example of terminal processing of two orthogonal lines. In this case, two wider orthogonal lines meet each other and terminate at the junction. Although the wide lines are treated as special lines in CAD, both of the horizontal line 811 and the vertical line 811 are extended by W/2, so that the end portions of these lines completely overlap each other, like in FIG. 1. Because the overlapped area is large, a connection pattern 805 having a plurality of cuts 817 is placed in the overlapped area.

It is easy for a CAD system to carry out the terminal processing to design interconnection consisting of only orthogonal lines in a orthogonal coordinate system, as shown in FIGS. 1 and 2.

However, as the configuration of semiconductor integrated circuits becomes finer and finer, a higher precision is required in every respect including a manufacture process and components of a semiconductor integrated circuit. In particular, a delay component caused by interconnection (or wiring) adversely affects the performance of the integrated circuit when the integrated circuit becomes finer. For this reason, it is an important subject how to reduce such delay in the integrated circuit.

Most of the delay components of interconnection are caused by a line resistance. The most effective way to reduce a line resistance is to reduce the line length. To this end, it has been proposed to use oblique lines, in addition to the basic orthogonal lines, to reduce the distance between two points in a semiconductor circuit. There is also a proposal to design a circuit layout using oblique lines on CAD. If using oblique lines in multi-layered integrated circuit, the shape and the forming process of via holes connecting basic orthogonal lines in a lower layer and oblique lines in an upper layer must be optimized.

The inventors of the present invention have proposed in Japanese Patent Application Nos. 10-176285 and 11-175930 a technique for greatly reducing a line resistance of oblique lines itself. This is achieved by setting the width and film thickness of the oblique line to $\sqrt{2}$ times as large as those of the basic orthogonal lines. In these publications, the optimal shapes of via holes for connecting metal lines of different layers are also proposed in order to reliably guarantee the cross-sectional area of the cut. The inventors also proposed a tree-type clock supply path comprised of a combination of oblique lines and the basic orthogonal lines.

However, no proposal has been made on a terminal processing for treating a terminal junction of an oblique line and a horizontal (or vertical) line on CAD.

SUMMARY OF THE INVENTION

Accordingly, it is an object of the present invention to provide an automatic layout method, which allows a CAD system to easily carry out terminal processing for treating end portions of lines, including oblique lines.

It is another object of the invention to provide an exposure mask set formed by the automatic layout method and suitably used to manufacture a multi-layered integrated circuit with oblique interconnection.

It is still another object of the invention to provide a semiconductor integrated circuit having an oblique line configuration, which can achieve faster and more precise operations.

It is yet another object of the invention to provide a large scaled integrated circuit (LSI) having a clock supply structure utilizing oblique lines.

It is yet another object of the invention to provide an LSI, in which a plurality of blocks are integrated, each block being capable of operating fast and accurately, in synchronization with others.

It is yet another object of the invention to provide a method of manufacturing a semiconductor integrated circuit having an oblique interconnection structure.

It is yet another object of the present invention to provide a storage medium storing a program for executing an automatic layout method. By loading this program on a CAD, the CSD can generate a circuit layout using oblique lines with less data amount.

To achieve these objects, in one aspect of the invention, an automatic layout method used to, for example, CAD is provided. With this method, a first line having a first width is generated in a prescribed direction. Then, a second line having a second width is generated so that the second line extends at an oblique angle with respect to the first line and terminates at an end portion of the first line with an overlapped area between the first and second lines. Then, one or more VIA patterns are placed in the overlapped area so that one of them is located at an intersection of the longitudinal center lines of the first and second lines.

Preferably, the method further comprises the step of detecting if there are any unnecessary areas projecting from the overlapped area, and deleting the unnecessary areas if there are any. By deleting the unnecessary area projecting from the overlapped area, the wiring resources (i.e., effective areas on a semiconductor substrate) can be efficiently used.

If one or both of the first and second lines have the minimum line width of the lithography technique, a single connection pattern is set at the intersection. If neither the first or second line has the minimum width, then, multiple connection patterns are set inside the overlapped area. In the latter case, the data processing time and amount can be reduced because only the same connection pattern is repeatedly generated.

The connection pattern is a combination of parallelograms (including squares and rectangles). At least a pair of parallel sides of the parallelogram is parallel to either the first or second line. In addition, the first and second lines can be reliably connected in an actual device manufactured from the layout.

The connection pattern consists of, for example, a first parallelogram, which is the end portion of the first line, a second parallelogram, which is the end portion of the second line, and a cut square placed inside the overlapped area of the first and second parallelograms. In this context, a parallelogram includes a square and a rectangle.

An assembled VIA pattern may be placed on the overlapped area if the overlapped area is relatively large. In this case, the assembled VIA pattern consists of a first parallelogram, which is the end portion of the first line, a second parallelogram, which is the end portion of the second line, and a set of cut squares in the overlapped area of the first and second parallelograms. One of the cut squares is located at the intersection of the first and second lines.

The first and second lines represent, for example, wiring patterns located in different layers of a semiconductor device. Alternatively, the first and second lines represent wiring patterns located in a same layer of a semiconductor device.

In another aspect of the invention, an exposure mask set used to manufacture a semiconductor device is provided. The mask set comprising at least a first mask having basic orthogonal line patterns, a second mask having aperture patterns for via holes, and a third mask having oblique line patterns. The aperture patterns of the second mask are aligned to the end portions of the orthogonal line patterns of the first mask. The oblique line patterns of the third mask extend at an oblique angle with respect to the orthogonal line patterns of the fist mask. The end portions of the oblique line patterns are aligned to both the end portions of the orthogonal line patterns of the first mask and the aperture patterns of the second mask.

By using this mask set, a multi-layered wiring structure using oblique lines can be manufactured, in which upper-layer lines and lower-layer lines are reliably connected, while preventing waste of the wiring resources at each layer.

In still another aspect of the invention, a semiconductor integrated circuit having an oblique line structure, which is manufactured using the above-mentioned mask set, is provided.

One example of such integrated circuit comprises a first wiring layer including orthogonal line patterns with a first line width, an insulating layer placed on the first wiring layer, and a second wiring layer placed on the insulating layer and including oblique line patterns with a second line width. Via contacts penetrate through the insulating layer in order to connect the orthogonal line patterns of the first layer and the oblique line patterns of the second layers. The end portions of the oblique line patterns are positioned directly above the end portions of the orthogonal line patterns of the first wiring layer. The via contact connects the orthogonal line pattern and the oblique line pattern at the end portions of these line patters. The horizontal cross-section of the via contact is square, and is completely inside the end portion of a narrower line pattern.

The end portion of an orthogonal line may be connected to the end portion of an oblique line through one or more via contacts. In this case, one of the via contacts is located at the intersection of the center lines of the orthogonal line and the oblique line.

Another example of the oblique-line integrated circuit comprises a PLL (phase-locked loop circuit) located at a corner of a chip, a main clock supply line extending from the PLL toward the center of the chip. The main clock supply line extends obliquely with respect to the orthogonal coordinate axes of the chip, and a clock tree extends from the end of the main clock supply line. The clock tree consists of clock lines that symmetrically branch off in oblique directions with respect to the basic orthogonal coordinate axes.

This configuration allows the load capacitance to be balanced in the chip, and allows the PLL to supply clocks accurately at a high speed.

The clock tree is comprised of multiple layers, and clock lines located in a same layer extends in a same oblique direction. This arrangement can reduce variations in signal transfer.

Still another example of the oblique-line integrated circuit comprises a PLL located at a corner of a chip, and a clock mesh covering the entire area of the chip. The clock mesh consists of oblique lines extending at an oblique angle with respect to the orthogonal coordinate axes of the chip. The clock mesh is formed in a same layer, thereby allowing a clock to be supplied to elements in the chip quickly.

Still another example of the oblique-line integrated circuit comprises a clock mesh consisting of oblique lines extending at an oblique angle with respect to the orthogonal coordinate axes of a chip, and a root driver for driving the entire clock mesh. A main clock supply line extends from the root driver, and multiple sub-drivers are connected to the main clock supply line. The sub-drivers drive the oblique lines independently. This arrangement can reduce a delay and a skew in the circuit.

In still another aspect of the invention, an LSI comprises a main PLL positioned near the periphery of a chip of the integrated circuit, a base-clock supply line extending from the main phase-locked loop, and a plurality of random blocks arranged in the chip. The base-clock supply line supplies a base clock (or a global clock) at a lower frequency. Each of the random blocks has a clock driver cell connected to the base-clock supply line, and a clock tree consisting of oblique lines. The clock driver cell converts the base clock into a higher frequency clock, and supplies the higher frequency clock to elements inside the associated block via the clock tree.

The base-clock supply line extends across the chip in a direction parallel to an orthogonal coordinate axis of the chip, or alternatively, it extends across the chip in a direction oblique with respect to the orthogonal coordinate axes of the chip.

Another example of the LSI comprises a main PLL positioned near the periphery of a chip, a base-clock supply line extending from the main PLL, and a plurality of random blocks having oblique clock meshes. The base-clock supply line supplies base clocks at a relatively low frequency. Each random block has a clock driver cell connected to the base-clock supply line. The clock driver cell converts the base clock into a higher frequency clock and supplies the higher frequency clock to elements inside the block via the oblique clock mesh.

By using the clock mesh consisting of oblique lines, high-frequency clocks can be supplied to various elements scattered in the block at the shortest distance with little delay.

In still another aspect of the invention, a Method for manufacturing a semiconductor integrated circuit is provided. With this method, first metal lines extending in a prescribed direction are formed on a semiconductor substrate. Then, an insulating layer is formed over the first metal lines and the semiconductor substrate. Then, via holes are formed in the insulating layer. The via-holes penetrate through the insulating layer and reach the end portions of the first metal lines. The bottom of each via hole is completely inside the associated first metal line. Then, the via-holes are filled with a conductive material to form contacts. Finally, second metal lines extending at an oblique angle with respect to the first metal lines are formed on the insulating layer, so that the end portions of the second metal lines completely cover the top faces of the contacts.

In still another aspect of the invention, a storage medium storing an automatic layout program is provided. This program is used to operate a CAD for designing, for example, an LSI. The program comprises the following steps:

causing the CAD to generate a first line having a first width and extending in a prescribed direction and a second line having a second width and extending at an oblique angle with respect to the first line, each of the first and second lines having a longitudinal center line;

causing the CAD to detect an overlapped area, in which the end portion of the first line and the end portion of the second line meet each other;

causing the CAD to detect an intersection of the longitudinal center lines of the first and second lines inside the overlapped area; and causing the CAD to read a connection pattern from a database based on the shape of the overlapped area, and to place the connection pattern at the detected intersection.

The storage medium includes, but are not limited to, external memory, a semiconductor memory, a magnetic disc, optical disc, an optomagnetic disc, a magnetic tape, and so on. Floppy diskette, CD-ROM. MO discs are also included in the storage medium. By installing the program into a CAD or other automatic layout design systems, a terminal area (or an overlapped area), at which an oblique line and an orthogonal line terminate, are treated with less data processing amount. In addition, the most suitable connection pattern is selected and placed at the terminal area, so that the oblique line and the orthogonal line are reliably connected in an actual device or circuit.

BRIEF DESCRIPTION OF THE DRAWINGS

Other objects, features, and advantages of the invention will be apparent from the following detailed description in conjunction with the attached drawings, in which:

FIG. 4 illustrates how the two lines shown in FIG. 3 are connected using a connection pattern, in which

FIG. 5 illustrates another example of connection between the basic orthogonal line and the oblique line with the minimum widths according to the first embodiment of the invention, in which

DETAILED DESCRIPTION OF THE PREFERRED EMBODIMENTS

<First Embodiment>

Figure 1A:
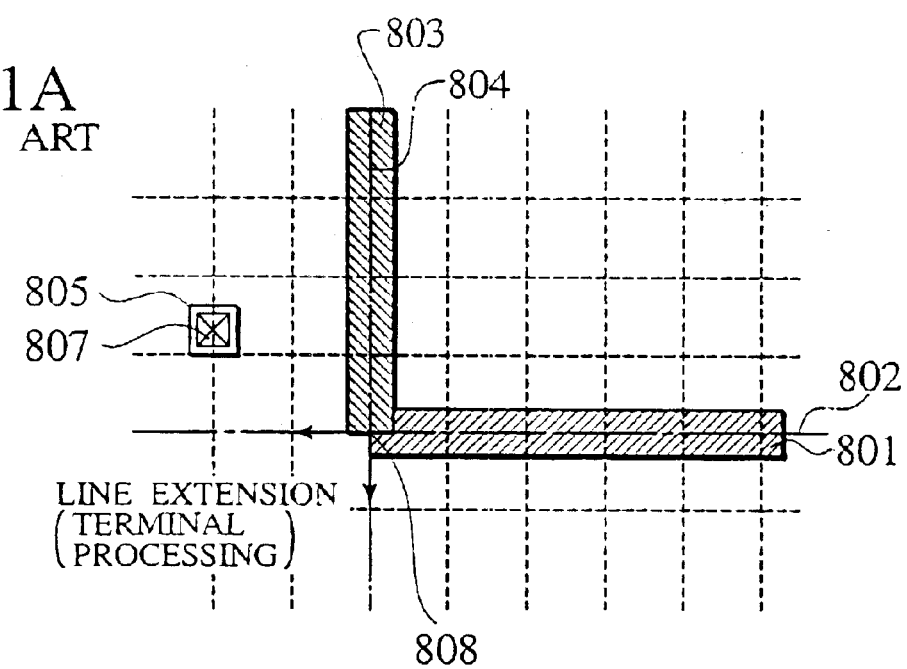
FIGS. 1A, 1B and 1C illustrate a terminal layout of basic orthogonal lines with the minimum width produced by a conventional automatic design method.
Figure 1B:
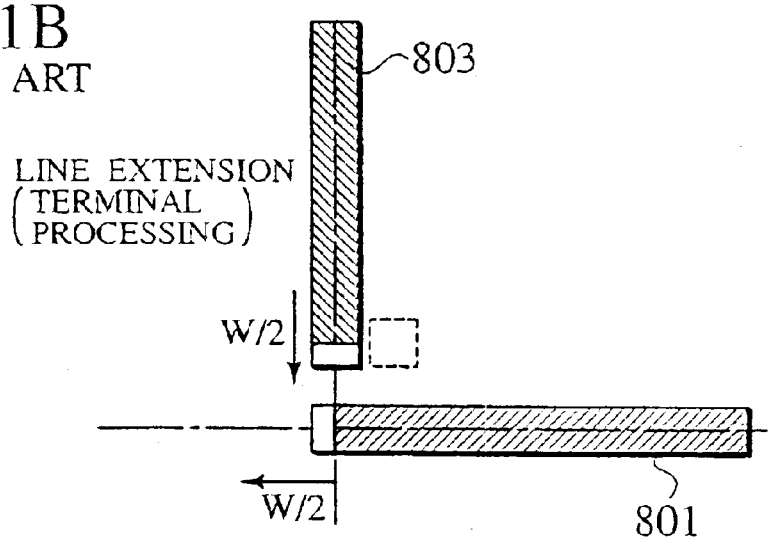
Figure 1C:
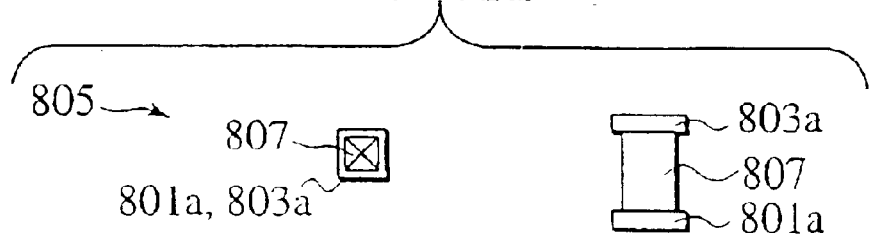
Figure 2:
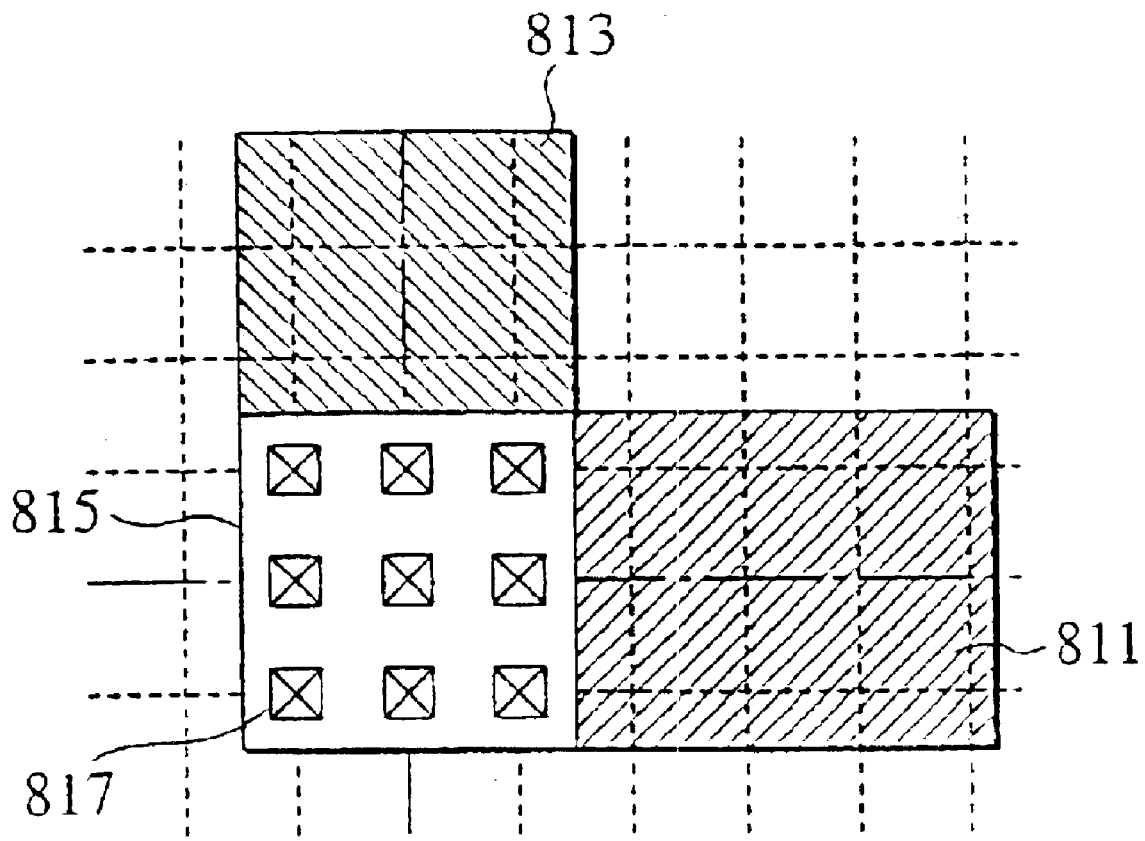
FIG. 2 illustrates a terminal layout of basic orthogonal lines with a greater width produced by a conventional automatic design method.
Figure 3:
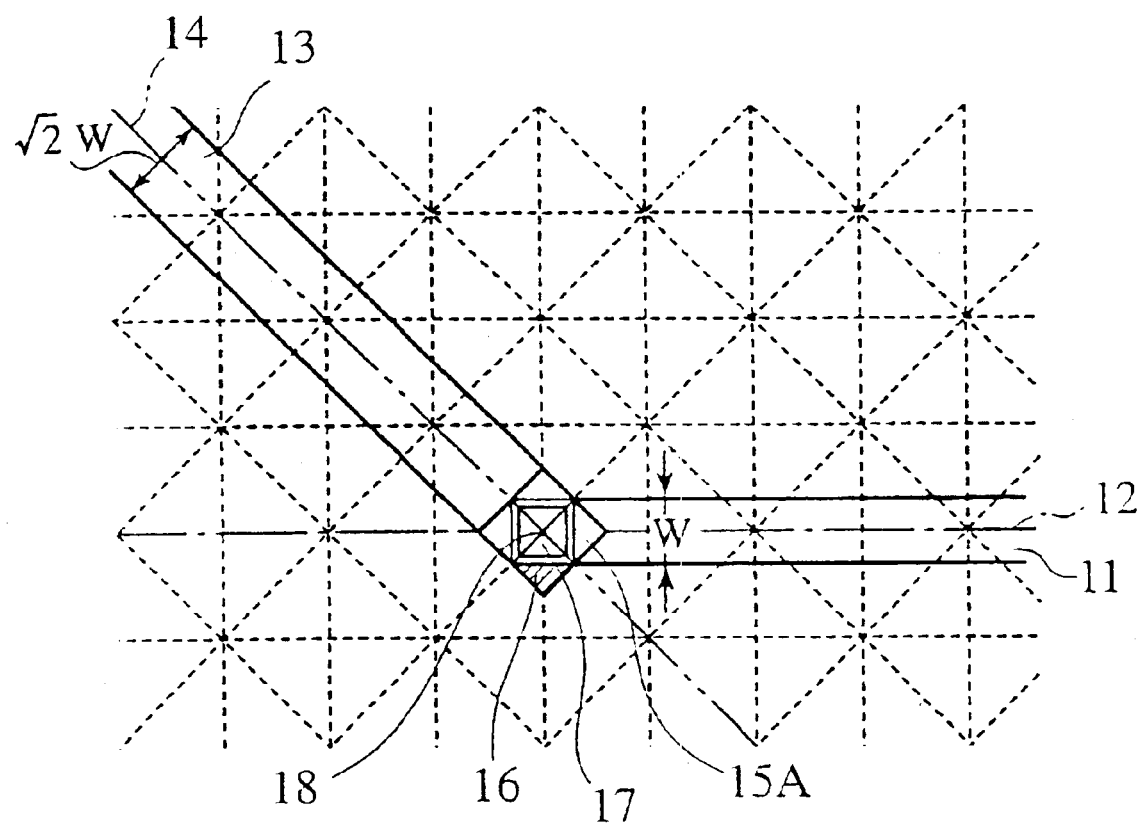
FIG. 3 illustrates a terminal layout of connection between a basic orthogonal line and an oblique line with the minimum widths produced by an automatic layout design method according to the first embodiment of the invention.

FIG. 3 is a terminal layout of two lines produced on a CAD based on an automatic design method according to a first embodiment. First, a horizontal line 1 with the minimal line width of lithography is produced. Then, an oblique line 13 whose line width is √2 times as large as horizontal line 1 is produced. The √2-time width of the oblique line is the minimum width of the oblique line in this invention. The oblique line 13 extends at an oblique angle (135 degrees in the illustrative embodiment) with respect to the horizontal line 11. The oblique line 13 terminates at the and portion of the horizontal line 11. The oblique line 13 may extend at an angle of 45 degrees or other angles with respect to the horizontal line 11. Such layouts are also included in the scope of the invention.

The end portion of the oblique line 13 overlaps the end portion of the horizontal line 11, and an overlapped area is formed. A connection pattern 15A for connecting the horizontal line 11 and the oblique line 13 is produced at an intersection 18 of the center line 12 of the horizontal line 11 and the center line 14 of the oblique line 13. The connection pattern is generally called a "via", which corresponds to a via-contact in the actual semiconductor integrated circuit device.

The connection pattern 15A has a cut pattern 17, which is the innermost cross-marked square in FIG. 3. The cut pattern 17 represents a via hole, in which a conductive material, such as doped poly-silicon, tungsten (W), molybdenum (Mo), titanium (Ti), or their silicide ($WSi_2$, $MoSi_2$, $TiSi_2$), is filled in order to connect the horizontal line 11 and the oblique line 13 in the actual semiconductor device. Hereinafter, a cut pattern produced in the layout is merely called "cut".

A significant feature of the automatic layout design shown in FIG. 3 is that the horizontal line 11 and the oblique line 13 sufficiently overlap each other at their terminal ends, and consequently, the projection 16 sticking out of the edge of the line is extremely small. In the layout of FIG. 3, projection due to the horizontal line 11 is zero, and the projection due to the oblique line 13 is only a small triangular region 16. Since the projection 16 is so small that it does not adversely affect the coupling capacitance between adjacent lines or the capacitance between the wiring pattern and the substrate. In addition, the wiring resource in the layer of the oblique lines is efficiently used minimizing wasted region in that layer.

With this layout, there is no need to delete the projection 16 because its area size is so small. In general, deleting a partial region of a line on the CAD layout, the wiring layout program becomes very complicated, and an increased amount of data processing is required. In contrast, the layout produced by the automatic design method shown in FIG. 3 does not require deletion of the unnecessary area (i.e., the projection 16), and is advantageous in view of programming.

Another significant feature of the layout shown in FIG. 3 is that the connection pattern 15A is generated in square shape only. Generating figures using only those lines crossing at right angle for the same layer (i.e., the same mask) requires relatively small amount of data, as compared with producing figures using non-orthogonal lines, such as a parallelogram or a diamond shape.

Figure 4A:
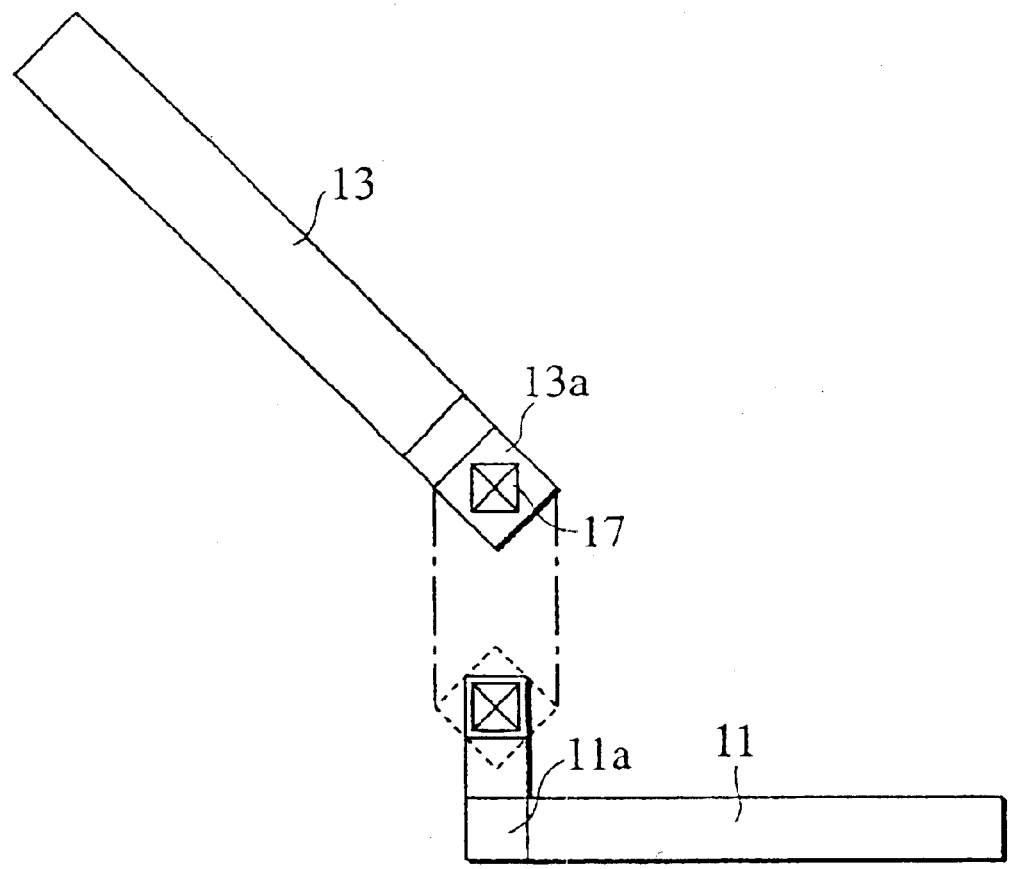
FIG. 4A is an exploded plane view of the orthogonal line and the oblique line to be connected.
Figure 4B:
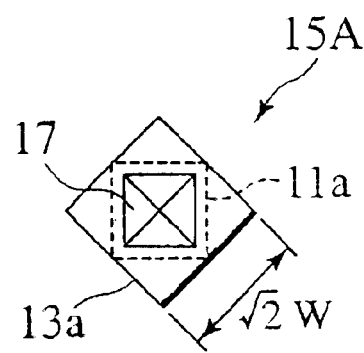
FIGS. 4B and 4C illustrate the connection pattern used to connect the two lines.
Figure 4C:
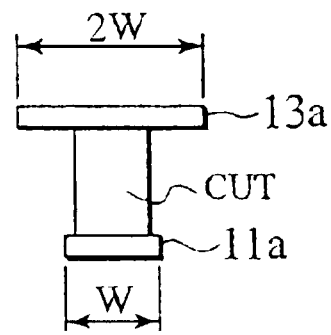

FIG. 4 illustrates the configuration of the connection pattern 15A. FIG. 4A shows the horizontal line 11 and oblique line 13 in an exploded manner for convenience of illustration. FIG. 4B and FIG. 4C are top and sectional views defining the shape of the connection pattern 15A on EDA (placement and routing tool). As is clearly shown in FIG. 4C, the connection pattern 15A is comprised of a top metal 13a, a bottom metal 11a, and a cut 17 for connecting the top and bottom metals.

The top metal 13a is a part of the end portion of the oblique line 13, and the bottom metal 11a is a part of the end portion of the horizontal line 11. In FIG. 4, both metals have square shapes whose sides are consistent with the sides of the lines 11 and 13. The shapes of the top and bottom metals may be rectangular, instead of square. In addition, a fringe may be provided to the top and/or bottom metals so that the metals expand beyond the are contour of the oblique and/or horizontal lines 13 and 11. In this case, the end portions of the oblique line 13 and the horizontal line 11 are expanded outward in advance. A cut 17 is defined inside the overlapped area between the top metal 13a and the bottom metal 11a.

FIG. 4B is a top view of the connection pattern 15A. The square drawn by the dashed line represents the bottom metal 11a. A connection pattern that consists of only squares of the minimum widths is called a standard via in this specification. To this regard, the connection pattern 15A shown in FIG. 4 is the standard via.

FIG. 4C is a sectional shape of the connection pattern 15A on EDA. The cut 17 is completely covered with the top metal 13a. With this configuration, a conductive material filled in the via hole can be prevented from melting out of the hole and vanishing during the etching step of the actual process for forming VIA contacts.

The automatic design method illustrated in FIG. 3 has advantages of not requiring deletion of unnecessary area, which results in reduced amount of data processing. In addition, a connection pattern can be generated by a combination of squares only, which also allows the amount of data processing to be reduced. The mask data for each layer contain only orthogonal line data. In this way, the overall computation of CAD is reduced, and consequently, the layout processing speed is improved. In addition, this arrangement facilitates verification of the design rule.

An actual semiconductor device manufacture by this method has a reliable performance because the via-holes filled with a metal are completely covered with the top metals, and the metal in the via-holes is prevented from melting out of the holes. The oblique line structure can improve the signal transfer speed to a target element (for example, a flip-flop).

Figure 5A:
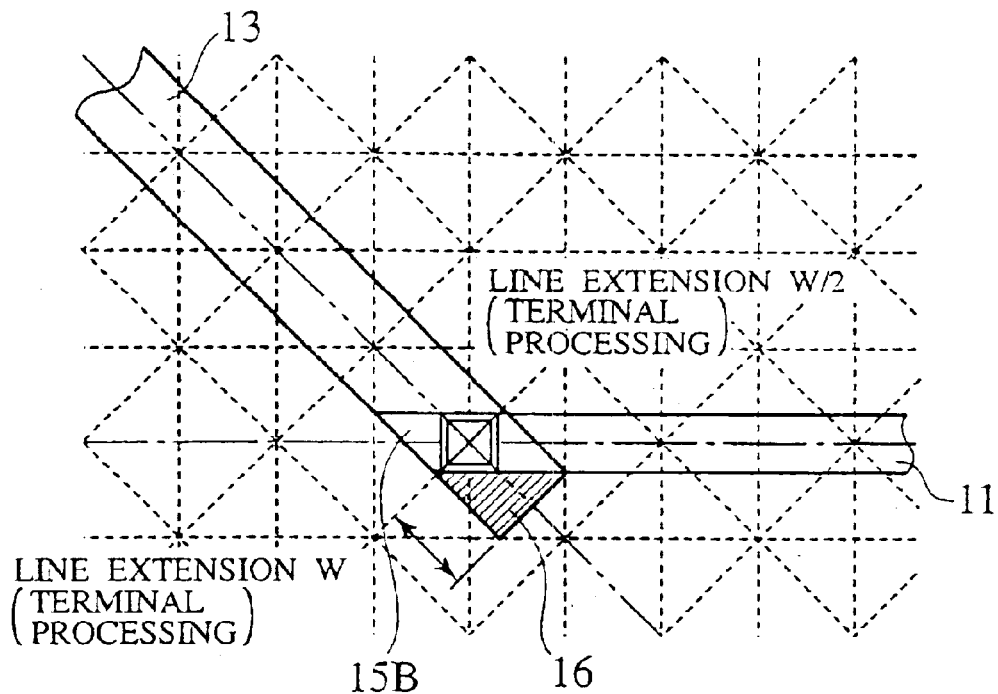
FIG. 5A is the layout before deletion of an unnecessary edge portions.

FIGS. 5 and 6 illustrate another example of automatic layout design for oblique line patterns with the minimum line width. In FIG. 5A, a horizontal line 11 of the minimum width is first produced. The end of the horizontal line 11 is extended by W/2 from the intersection 18 as in FIG. 3. Then, an oblique line 13, which is $\sqrt{2}$ times as wide as the horizontal line 11, is produced. The end of the oblique line 13 is extended from the intersection 18 by an amount W so that the end portion of the oblique line 13 sufficiently overlaps the horizontal line 11. A connection pattern 15B of a parallelogram is defined at the intersection 18 of the center line 12 of the horizontal line 11 and the center line 14 of the oblique line 13.

In this example, a large area of projection 16 is produced due to the oblique line 13. This projection 16 becomes a waste of the wiring resources, and it may adversely affect the coupling capacitance between adjacent lines. For this reason, the protrusion 16 is to be deleted on the layout.

Figure 5B:
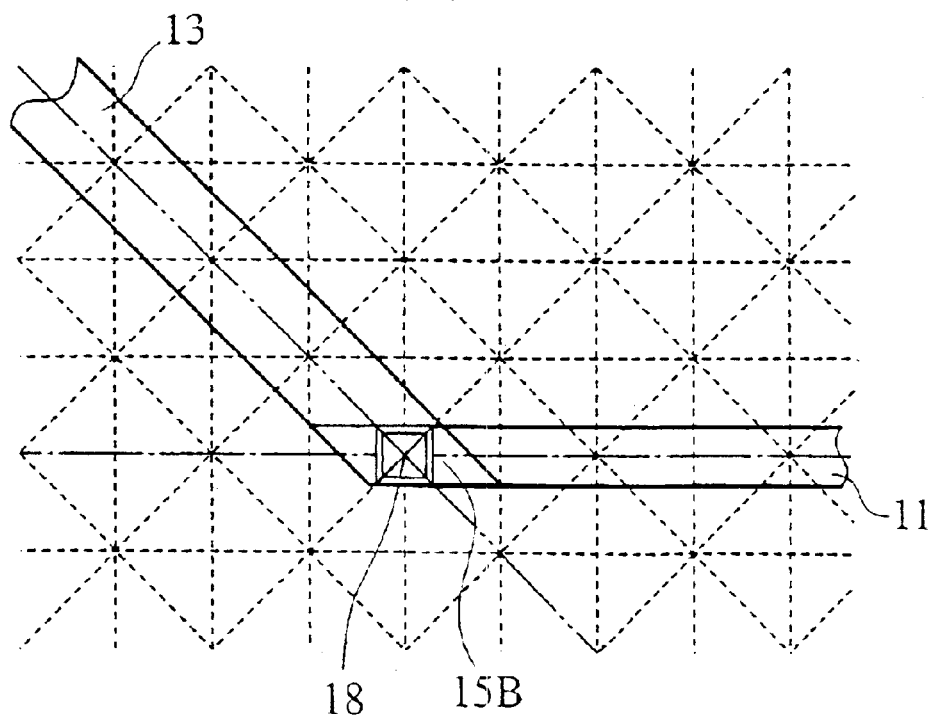
FIG. 5B is the layout after the deletion.

FIG. 5B illustrates a layout after deletion. The deletion of a part of the line requires an increased amount of programming data in CAD. However, deletion of the projection 16 can remove the problems of adverse influence to the coupling capacitance and waste of the wiring resources. In addition, the oblique line 13 completely overlaps the horizontal line 11 at the parallelogramic area. This means that these two lines are securely connected to each other in an actual device.

Figure 6A:
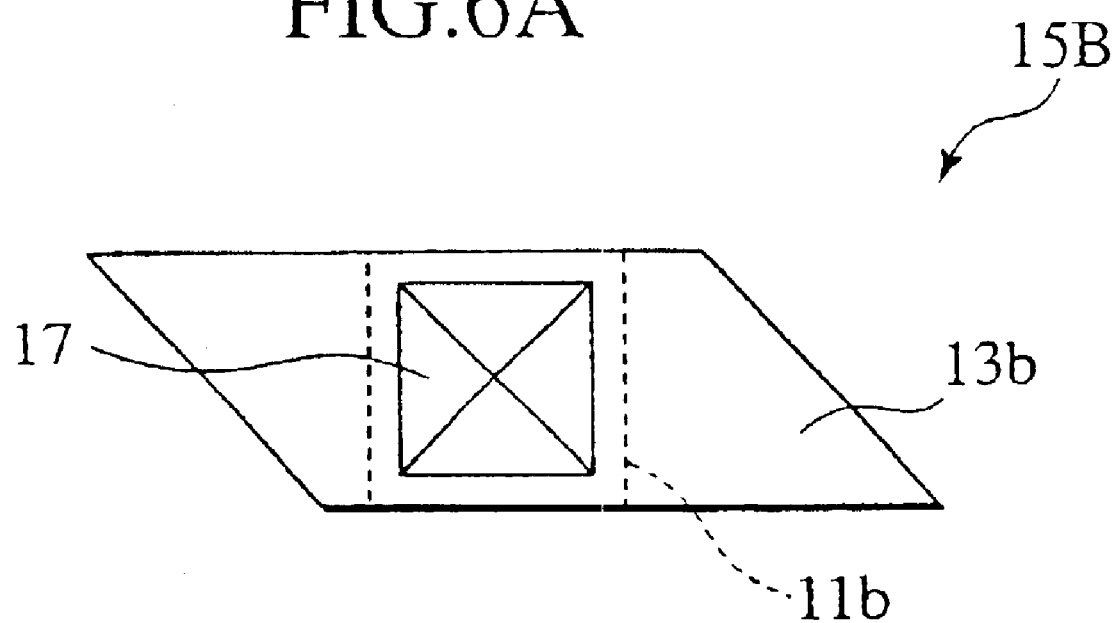
FIGS. 6A and 6B illustrate the connection pattern used in the layout shown in FIG. 5.
Figure 6B:
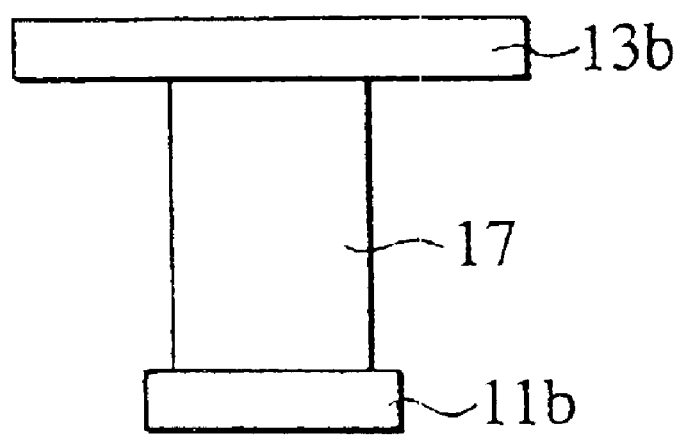

FIG. 6 illustrates the connection pattern 15B more clearly in a top view shown in FIG. 6A and a sectional view shown in FIG. 6B. The connection pattern 15B consists of a parallelogramic top metal 13b, a square bottom metal 11b, and a cut 17. The top metal 13b is apart of the end portion of the oblique line 13. The bottom metal 11b is a part of the end portion of the horizontal line 11. The cut 17 is positioned inside the overlapped area between the top metal 13b and the bottom metal 11b.

In order to define the connection pattern 15B on CAD, it is better to generate a parallelogramic connection pattern on the program in advance and to store it in, for example, a library. Producing the bottom metal 11b and the cut 17 for the connection pattern 15B is easy because of their square shapes. On the other hand, generating the parallelogramic top metal 13b on the layout requires a great amount of computation. Accordingly, it is much efficient to produce the parallelogramic connection pattern 15B on the program in advance, and store it in the database. The connection pattern 15B is read out of the database when it is required. This method can facilitate the terminal treatment of oblique line patterns. By using the connection pattern 15B, the top metal 13a securely covers the cut 17, and prevents the metals in the lower layers from melting during the actual process at a high temperature.

For producing and storing a connection pattern of a parallelogram, a parallelogram may be defined as it is, or alternatively, it may be defined by dividing into triangles and rectangles in accordance with the actual process.

Although, in the first embodiment, the horizontal line 11 is in a lower layer and the oblique line 13 is in an upper layer, the location of these lines may be reversed. Such a configuration can also achieve the same effect and advantages of the invention. The horizontal line 11 may be a vertical line, as long as it is parallel to the orthogonal coordinate axes of the layout. The present invention is not limited to the two-layer structure, but is also applicable to multi-layered structure including three or more layers and three-dimensional interconnections.

<Second Embodiment>

Figure 7:
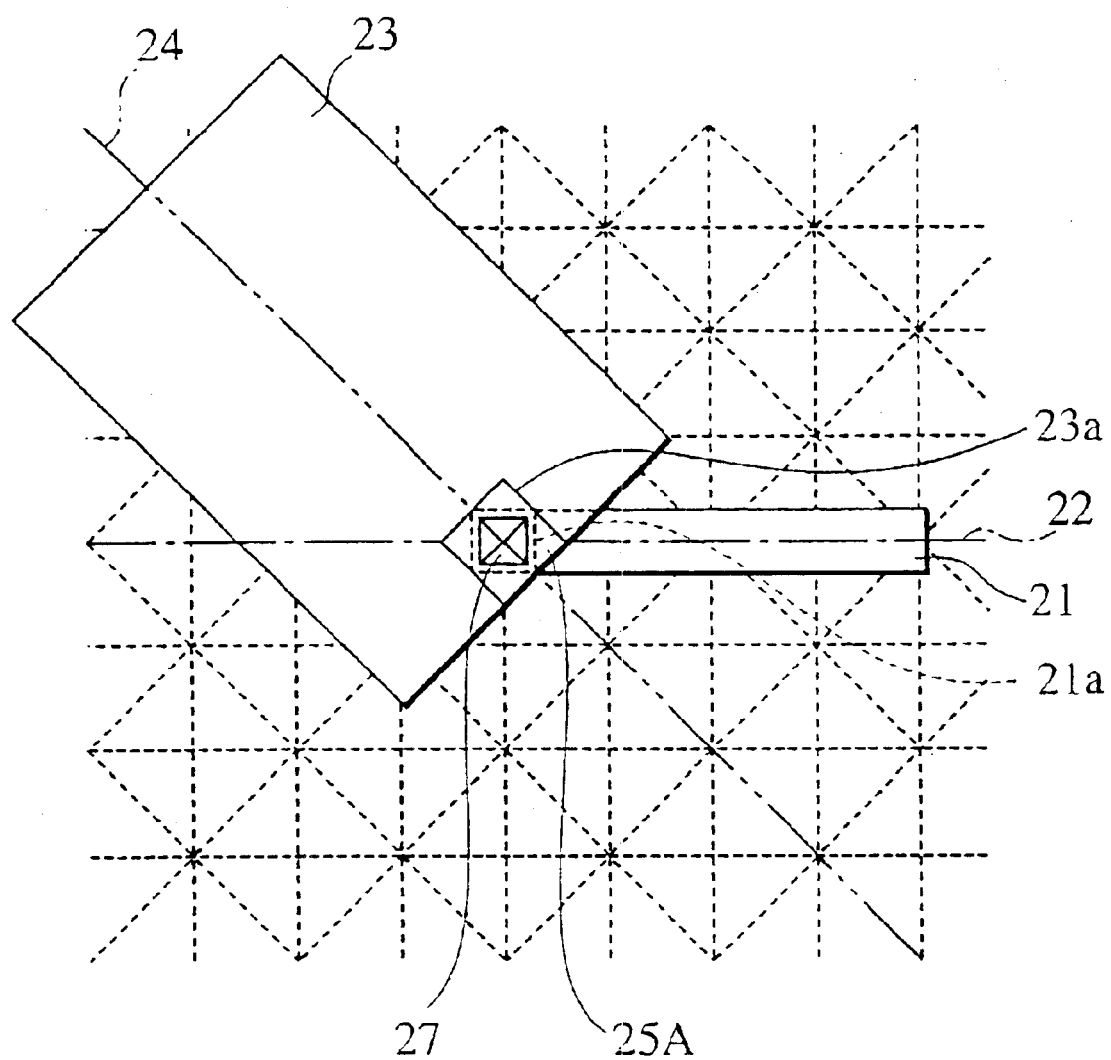
FIG. 7 illustrates a terminal layout of connection between a basic orthogonal line and a wide oblique produced by an automatic layout design method according to the second embodiment of the invention.

FIG. 7 illustrates a terminal layout of an oblique line and a horizontal line whose line widths are greatly different. In the example shown in FIG. 7, the oblique line 23 is much wider than the horizontal line 21 that has the minimum width of lithography.

First, a horizontal line 21 with the minimum width is generated. Then, an oblique line 23 is generated at an oblique angle (135 degrees in FIG. 7) with respect to the horizontal line 21, so that the end portion of the oblique line 23 overlaps the end portion of the horizontal line 21. Then, a connection pattern 25A is placed at the intersection of the center line 22 of the horizontal line 21 and the center line 24 of the oblique line 23. The crossed square inside the connection pattern 25A is a cut 27 for connecting the horizontal line 21 and the oblique line 23.

The connection pattern 25A used in this layout is a standard via. This pattern is the same as the connection pattern 15A of the first embodiment shown in FIGS. 4B and 4C. The connection pattern 25A includes a square 23a located at the middle of the end of the oblique line 23, which represents an top metal 23*a*, and an and square 21*a* of the horizontal line 21 indicated by dashed line, which represents a bottom metal 21*a*.

As described above, CAD generally recognizes a crossing point, at which the longitudinal center lines of two metal lines cross each other, as an intersection of the metal lines, regardless of the line width, in order to handle graphic data efficiently. If the oblique line 23 is moved upward a little more, no intersection will exist in the overlapped area, and a connection pattern cannot be defined. Accordingly, the location of the oblique line 23 shown in FIG. 7 is the upper limit. With this layout, the VIA pattern 25A (including the cut and the upper and lower metals) is completely included in the wide oblique line 23, and there is no need to delete any portions on the layout, while achieving reliable connection.

Since deletion on the layout is not required, increase in the amount of program data can be prevented, as in the first embodiment. The pattern in each layer is generated using orthogonal lines only, which leads to the reduced amount of graphic data for each mask. Consequently, the overall computation in CAD is reduced, and verification of the design rule can be facilitated.

Figure 8:
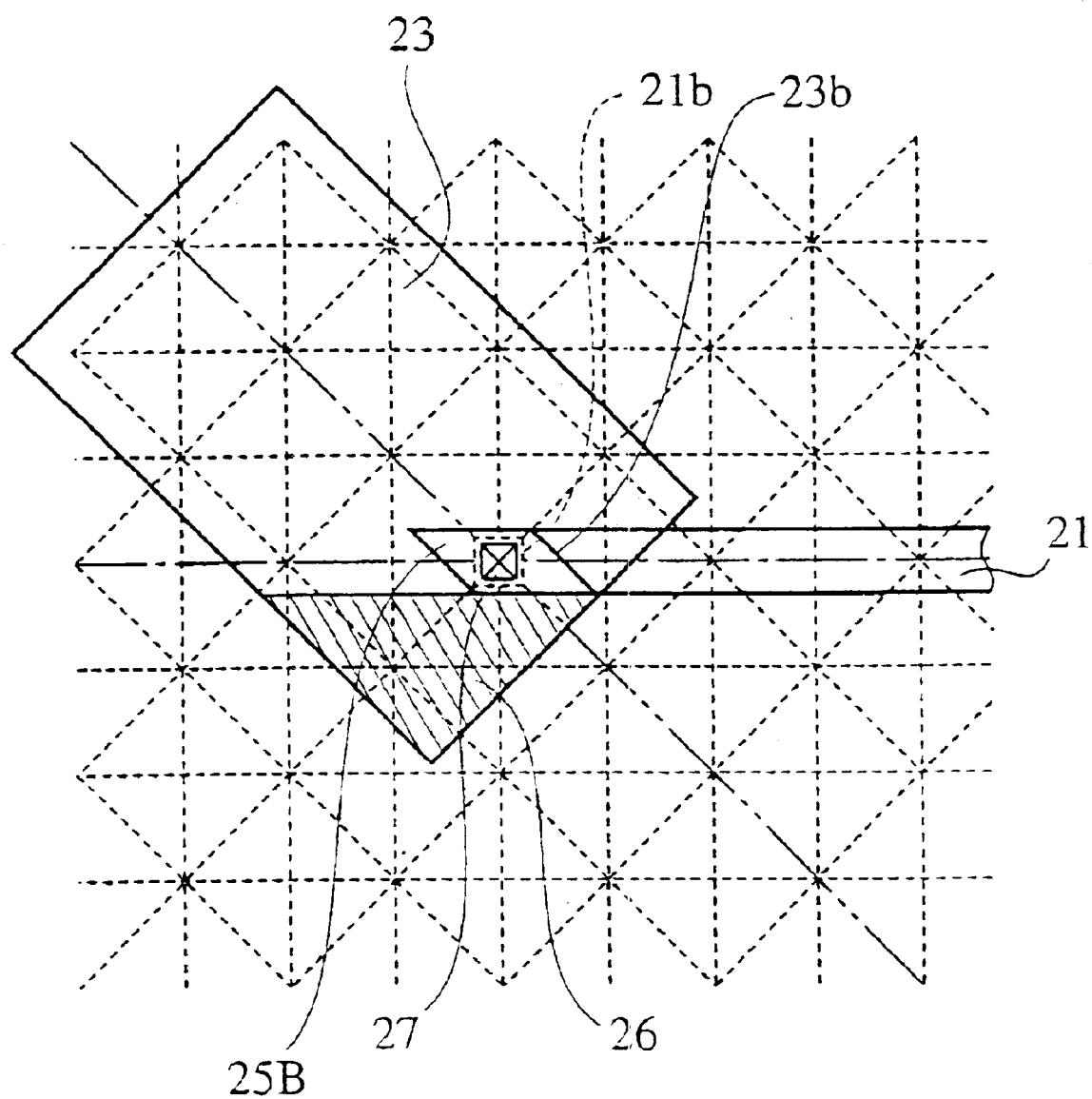
FIG. 8 illustrates another example of terminal layout of the orthogonal line and the oblique line with different widths according to the second embodiment of the invention.

FIG. 8 illustrates another example of a terminal layout of a wide oblique line, in which an unnecessary projection 26 is to be deleted after the horizontal line 21 and the oblique line 23 are produced. As a result of the deletion, the lower end of the oblique line 24 is aligned with the longer side of the horizontal line 21. Then, a parallelogramic connection pattern 25B is placed at the intersection of the two lines 24 and 22. In this example, a parallelogram that is a part of the end portion of the oblique line 23 becomes the top metal 23*b*, and a square that is a part of the end portion of the horizontal line 21 becomes the bottom metal 21*b*. A square cut 27 is formed inside the overlapped area between the top and bottom metals 23*b* and 21*b*.

The amount of data processing increases because of the deletion of the projection 26. However, this deletion allows the contour of wiring pattern to be greatly simplified. Since the cut 27 is located deeply inside the, oblique line 23, the horizontal line 21 and the oblique line 23 are securely connected by a via-contact in an actual device.

The number of layers and which layer contains the oblique lines are not limited to the aforementioned example.

<Third Embodiment>

In the third embodiment, a wide oblique line and a wide horizontal line cross each other and terminate at the intersection of these lines. In other words, the third embodiment illustrates a terminal layout of connection of the oblique line and the basic orthogonal line, both having line widths greater than the minimum width of lithography.

Figure 9A:
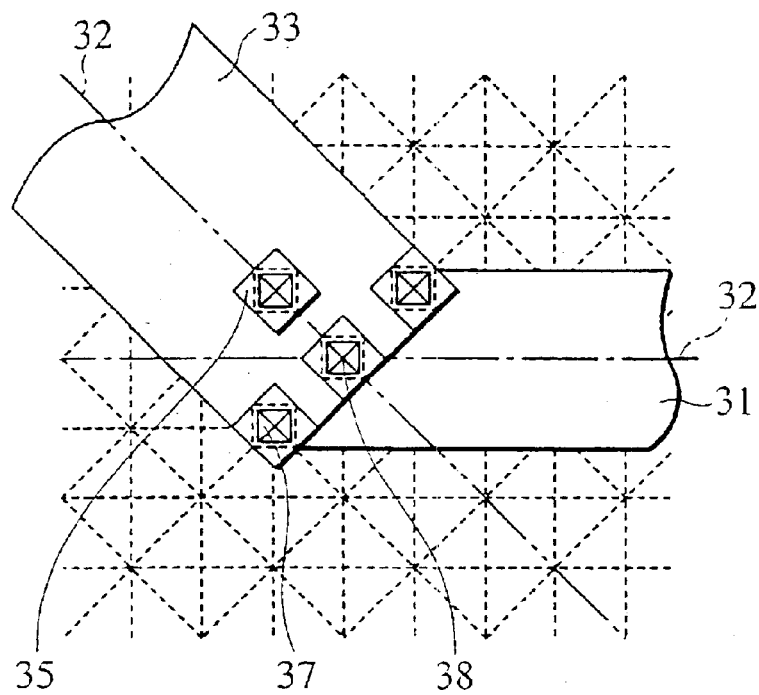
FIGS. 9A and 9B illustrate a terminal layout of connection between a wide orthogonal line and a wide oblique line according to the third embodiment of the invention, in which multiple connection patters are arranged in an overlapped area between the orthogonal line and the oblique line.
Figure 9B:
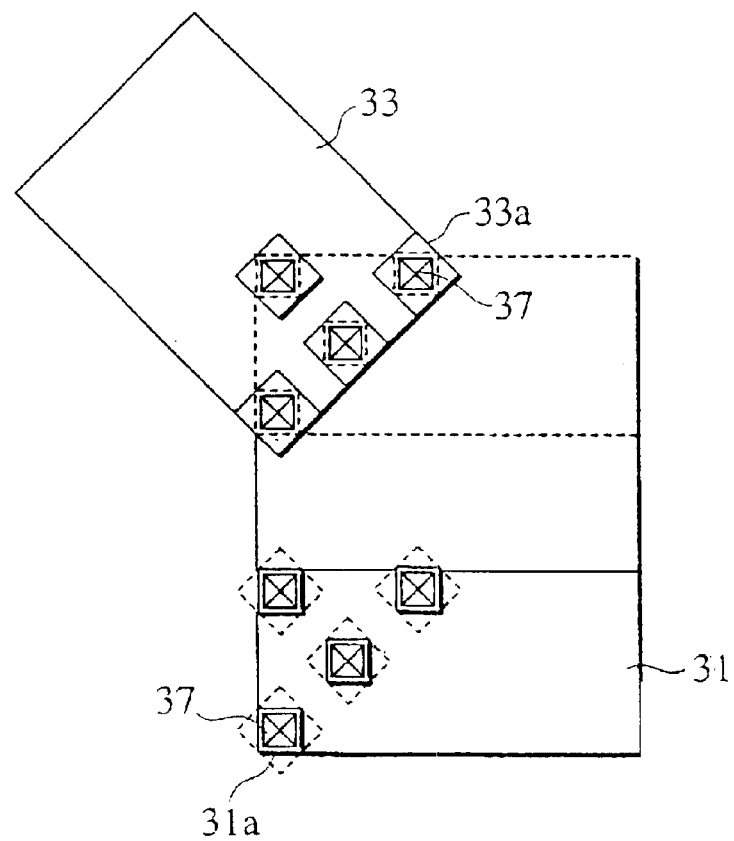

FIG. 9A illustrates a terminal layout of connection between a wide oblique line 33 and a wide horizontal line 31. FIG. 9B is an exploded view of the oblique line 33 in, for example, an upper layer and the horizontal line 31 in a lower layer.

First, a wide horizontal line 31 is produced. Then, an oblique line 33 that extends at an oblique angle (e.g., 135 degrees) with respect to the horizontal line 31 is generated so that the end of the oblique line 33 overlaps the end of the horizontal line 33. As a feature of this embodiment, a plurality of connection patterns 35 are placed in the overlapped area. One of the connection patterns 35 must be placed at the intersection of the center line 32 of the horizontal line 31 and the center line 34 of the oblique line 33.

In the example shown in FIG. 9, four standard-via patterns 35 are used. Each connection pattern 35 consists of a square top metal 33*a*, a square bottom metal 31*a*, and a square cut 37 inside the bottom metal 31*a*. The top metal 33*a* is a square region that is a part of the oblique line 33. The bottom metal 31*a* is also a square region that is a part of the horizontal line 31.

With this layout, there is almost no projection that comes out of the contour of the lines. Accordingly, later processing, such as deletion, is not required. Since multiple standard-via patterns, which are most easily generated, are disposed in the overlapped area, the oblique line 33 and the horizontal line 31 are securely connected without oozing of melting metals.

<Fourth Embodiment>

In the fourth embodiment, an assembled connection pattern is used in place of a plurality of independent standard-via patterns for connecting two wide lines. The assembled connection pattern consists of a top metal, a bottom metal, and a set of cuts in the overlapped area of the top and bottom metals. The assembled connection pattern is automatically generated by a CAD system in accordance with prescribed rules.

Figure 10A:
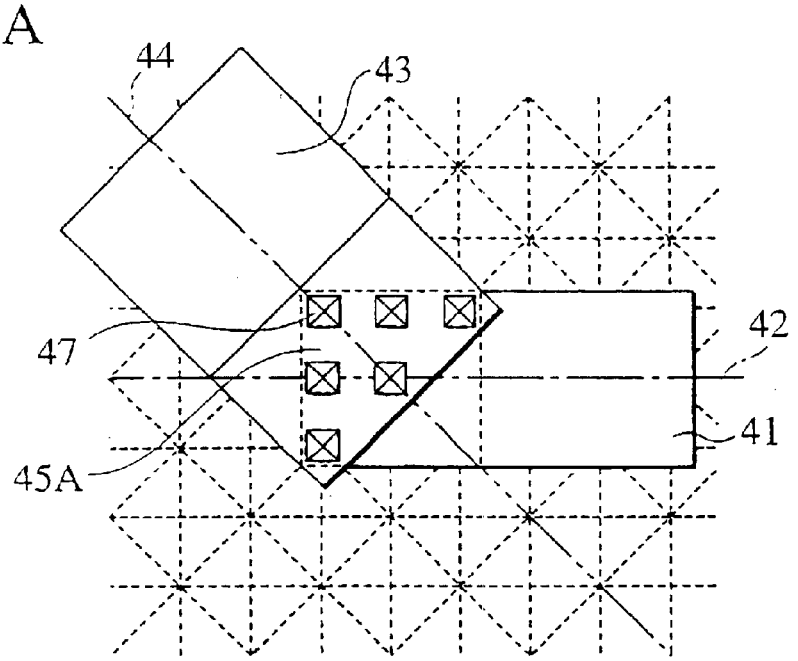
FIGS. 10A, 10B and 10C illustrate a terminal layout of connection between a wide orthogonal line and a wide oblique line according to the fourth embodiment of the invention, in which a assembled connection pattern is used.

In FIG. 10A, the end portion of a wide oblique line 43 overlaps the end portion of a wide horizontal line 41, and an assembled connection pattern 15A is placed in the overlapped area. To produce the layout shown In FIG. 10, wide horizontal line 41 is produced. A wide oblique line 43 extending at an oblique angle (135 degrees in FIG. 10) with respect to the horizontal line 41 is produced. Then, an assembled connection pattern 45A is placed at the intersection of the oblique line 43 and the horizontal line 41.

Figure 10B:
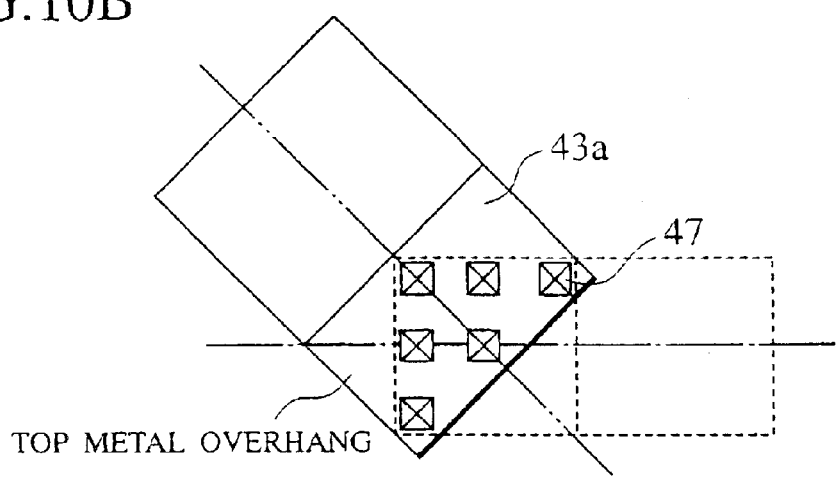
Figure 10C:
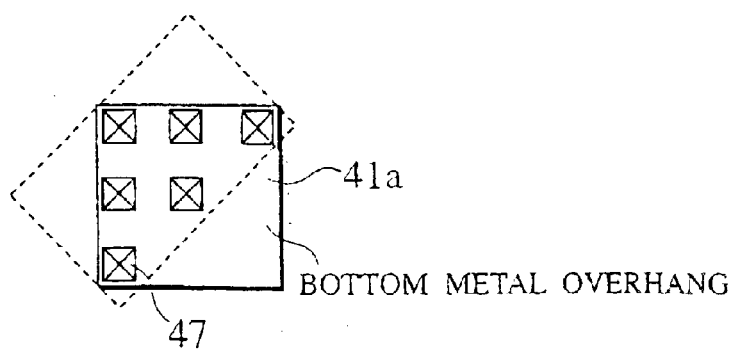

FIG. 10B shows the top metal 43*a* of the connection pattern 45A, which makes use of the end portion of the oblique line 43, and the cuts 47 arranged at a predetermined interval inside the overlapped area. FIG. 10C shows the bottom metal 41*a*, which makes use of the end portion of the horizontal line 41, and the cuts 47. As is shown in FIGS. 10B and 10C, one of the cuts 47 must be positioned at the intersection of the center line 42 of the horizontal line 41 and the center line 44 of the oblique line 43. The other cuts 47 are positioned at the grid points of the orthogonal coordinate system inside the overlapped area.

In the example of FIG. 10, the top metal 43*a* is a rectangle rotated by 45 degrees with respect to the square bottom metal 41*a*. The rectangular top metal is generated using orthogonal lines only, and therefore the amount of data does not increase. In addition, there is almost no projection that comes out of the contour of lines, and deletion process is unnecessary.

The connection pattern 35A shown in FIG. 10 has overhangs in which cuts cannot be applied. To be more precise, both the top metal 43*a* and the bottom metal 41*a* have triangle areas (i.e., overhangs) in which no cuts are defined. However, the maximum number of cuts under the adapted design rule are defined in the overlapped area, and as a result, the total number of cuts in the assembled connection pattern becomes greater than the number of the independent connection patterns used in the third embodiment. This further results in that the resistance of the via-contact manufactured from the assembled connection pattern is reduced, as compared with the arrangement shown in FIG. 9.

Figure 11A:
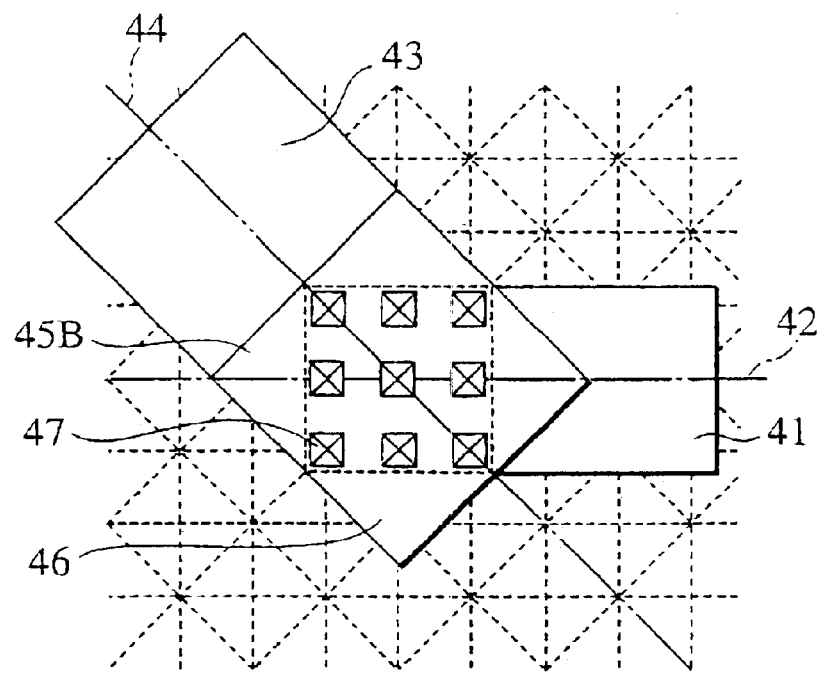
FIGS. 11A, 11B and 11C illustrate another example of terminal layout of connection between two wide lines according to the fourth embodiment, in which an assembled connection pattern of another shape is used. shape is used.

FIG. 11 illustrates another layout of terminal connection using an assembled connection pattern. In this layout, a wide horizontal line 41 is produced, and a wide oblique line 43 is produced so that its end portion sufficiently overlaps the end portion of the horizontal line 41. A square assembled connection pattern 45B is placed in the overlapped area. The overlapped area between the horizontal line 41 and the oblique line 43 is larger than the overlapped area of the assembled connection pattern 45A shown in FIG. 10. On the other hand, the projection 46 (FIG. 11A) coming out of the contour of the line becomes large.

Figure 11B:
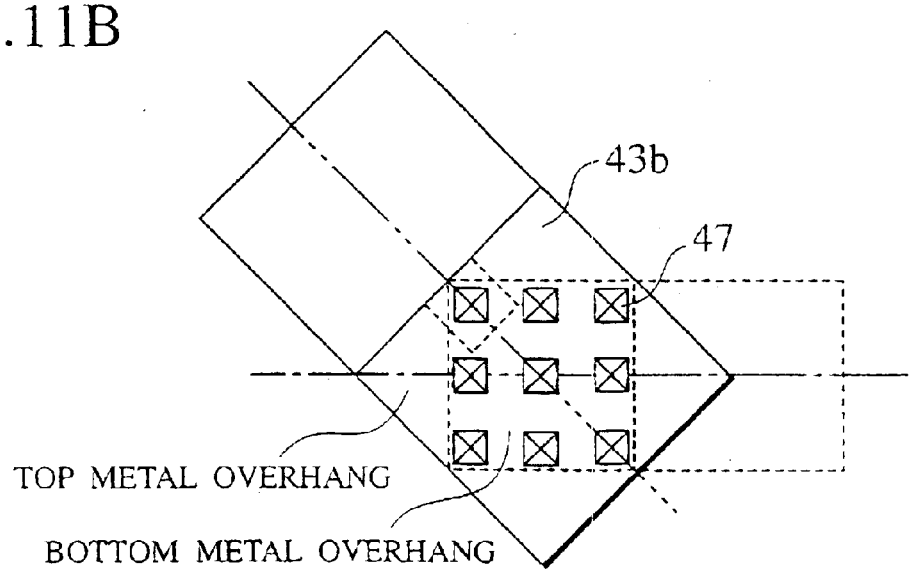
Figure 11C:
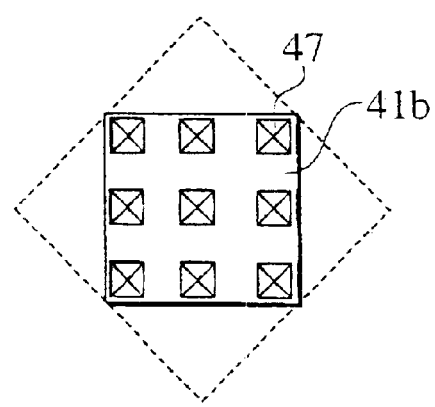

The assembled connection pattern 45B consists of a square top metal 43b, which makes use of the end portion of the oblique line 43, a square bottom wall 41b, which makes use of the end portion of the horizontal line 41, and multiple cuts 47. The cuts are positioned at the grid points inside the overlapped area (FIG. 11B). One of the cut is positioned at the intersection of the center line 42 of the horizontal line 41 and the center line 44 of the oblique line 43 within the square of the bottom metal 41b (FIG. 11C).

In comparison with the arrangement shown in FIG. 10, the number of cuts is further increased, and the resistance in the actual device is further reduced. Although a slight loss occurs in integration degree because the triangle projection 46 is left as it is, the layout of FIG. 11 is superior in that the assembled connection pattern is created in the easiest manner on CAD because it consists of squares only. This layout allows the minimum amount of data processing because of the easy connection pattern and no deletion of the projection.

<Fifth Embodiment>

Figure 12A:
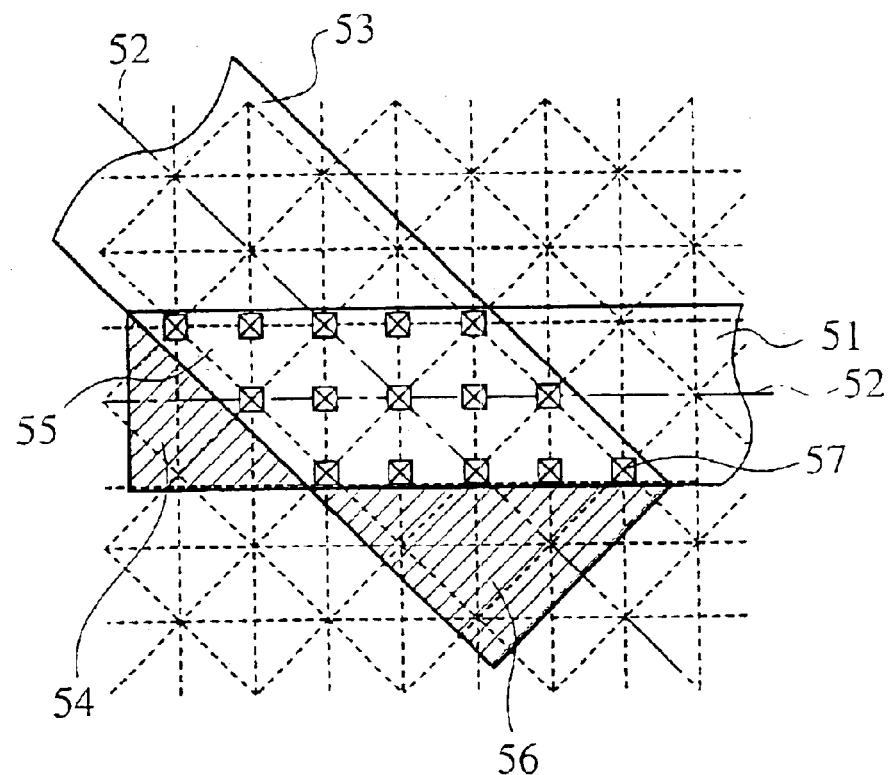
FIGS. 12A and 12B illustrate a terminal layout of connection between a wide orthogonal line and a wide oblique line according to the fifth embodiment of the invention, in which an assembled connection pattern of parallelogram is used and unnecessary edge portions are to be deleted.

FIG. 12 illustrates a terminal layout of two lines using an assembled connection pattern of parallelogram. In FIG. 12A, a wide horizontal line 51 is produced, and a wide oblique line 53 is produced so that the end portion sufficiently overlaps the end portion of the horizontal line 51. An assembled connection pattern 55 of a parallelogram is placed in the overlapped area.

Figure 12B:
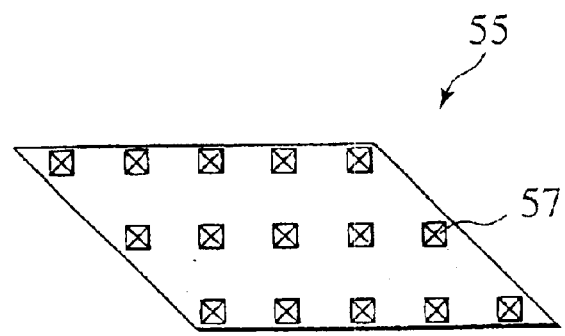

In this layout, unnecessary projections 56 are produced in both the horizontal line 51 and the oblique line 53. These projections 56 may adversely affect the wiring resource or the coupling capacitance. Therefore, the projections 56 are deleted after the horizontal and oblique lines are produced. As a result of the deletion, the lines have a simple contour with the parallelogramic overlapped area. Then, an assembled connection pattern 55 is placed in the overlapped area, so that one of the cuts 57 is positioned at the intersection of the center line 52 of the horizontal line 51 and the center line 52 of the oblique line 53 (FIG 12B). The other cuts 57 are defined at the grid points of the orthogonal coordinate system inside the overlapped area.

With the terminal layout shown in FIG. 12, the wiring layout program becomes slightly complicated because deletion of projections is required. However, the line shape is greatly simplified, and adverse influence to the coupling capacitance can be prevented. It is better to prepare the parallelogramic connection pattern 55 in advance on the program. This layout can guarantee reliable connection between the horizontal line and the oblique line located in different layers because of sufficient overlapped area and the increased number of cuts.

<Sixth Embodiment>

The first through fifth embodiments illustrate the terminal layouts for connecting two lines located in different layers. In the sixth embodiment, a terminal layout for connection of an oblique line and a basic orthogonal line located in the same layer is provided.

Figure 13A:
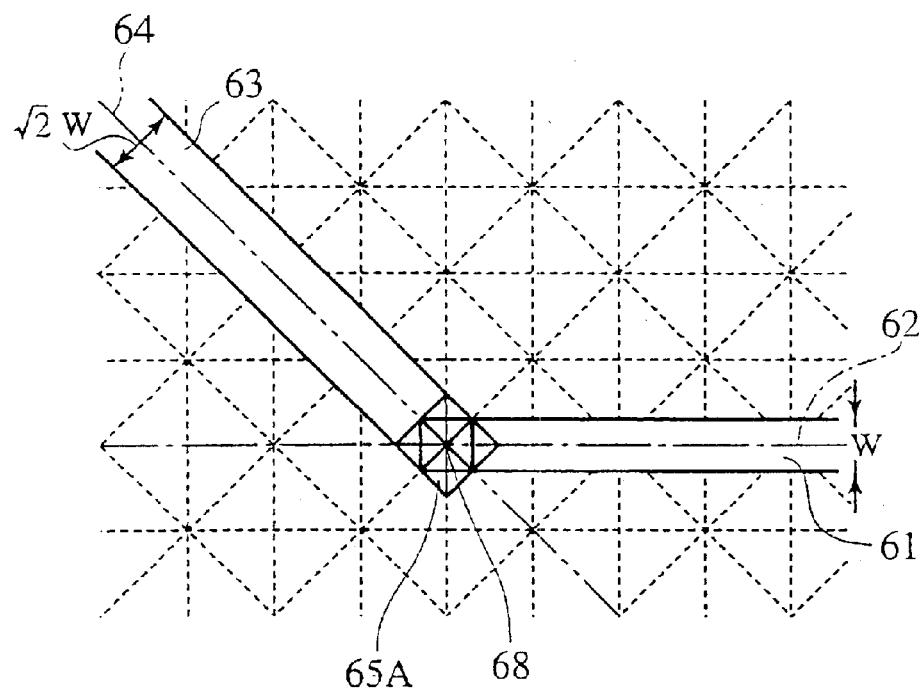
FIGS. 13A and 13B illustrate a terminal layout of connection between an oblique line and an orthogonal line in a same layer using a turn-VIA pattern according to the sixth embodiment of the invention.
Figure 13B:
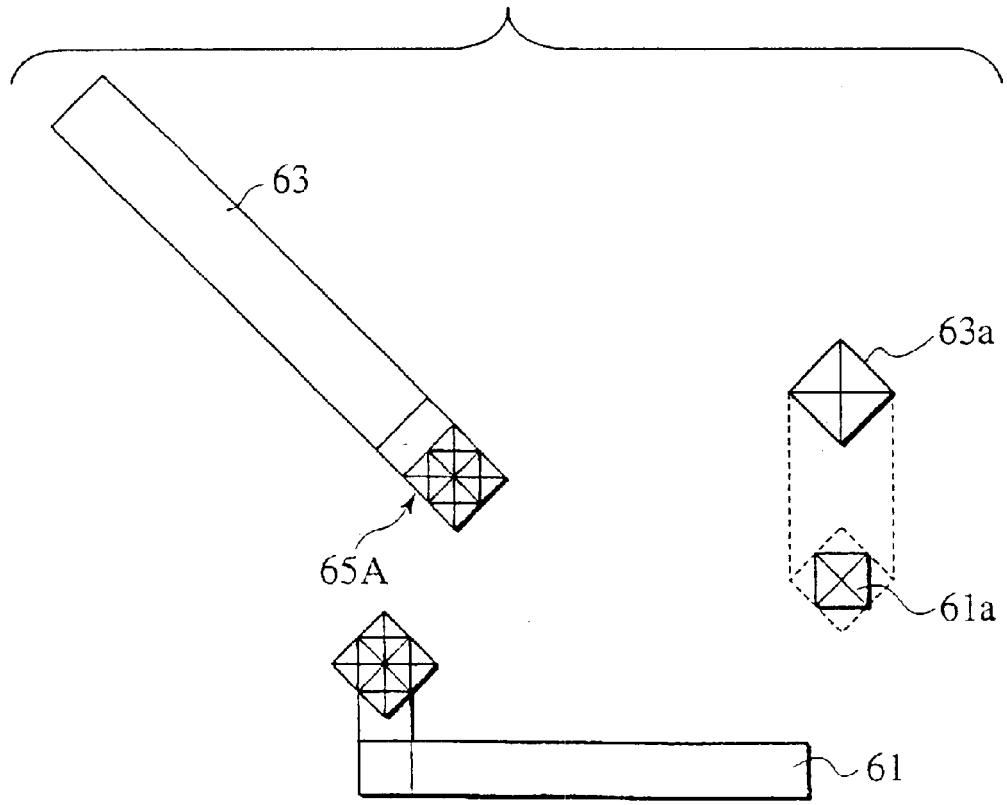

In FIGS. 13A and 13B, a horizontal line 61 with the minimum line width W is produced, and an oblique line 63 with the minimum width $\sqrt{2}$ W is produced. The CAD recognizes the intersection 68 of the center line 62 of the horizontal line 61 and the center line 64 of the oblique line 63, and therefore, it recognizes that these two lines cross each other. The CAD also needs to know that these two lines 61 and 61 must be actually connected to each other, in addition to the fact that the two lines cross each other at the intersection 68. To this regard, a plane connection pattern 65A must be placed in the overlapped area between the horizontal line 61 and the oblique line 63. A connection pattern for connecting those lines located in the same layer is called a "turn via".

The plane connection pattern (i.e., the turn via) 65A consists of two squares. As shown in FIG. 13A, the line width of the horizontal line 61 is W, and the line width of the oblique line 63 is $\sqrt{2}$ W. Thus, the square 61a, which is the end portion of the horizontal line 61, is completely included in the square 63a, which is the end portion of the oblique line 63. Since the turn via 65A is easy to produce because of the simple combination of two squares, the terminal layout using an automatic layout design technique is greatly simplified when connecting an oblique line and a basic orthogonal line in the same layer at their end portions.

FIG. 14 illustrates another terminal layout for connecting two lines having the same line width and located in the same layer.

Figure 14A:
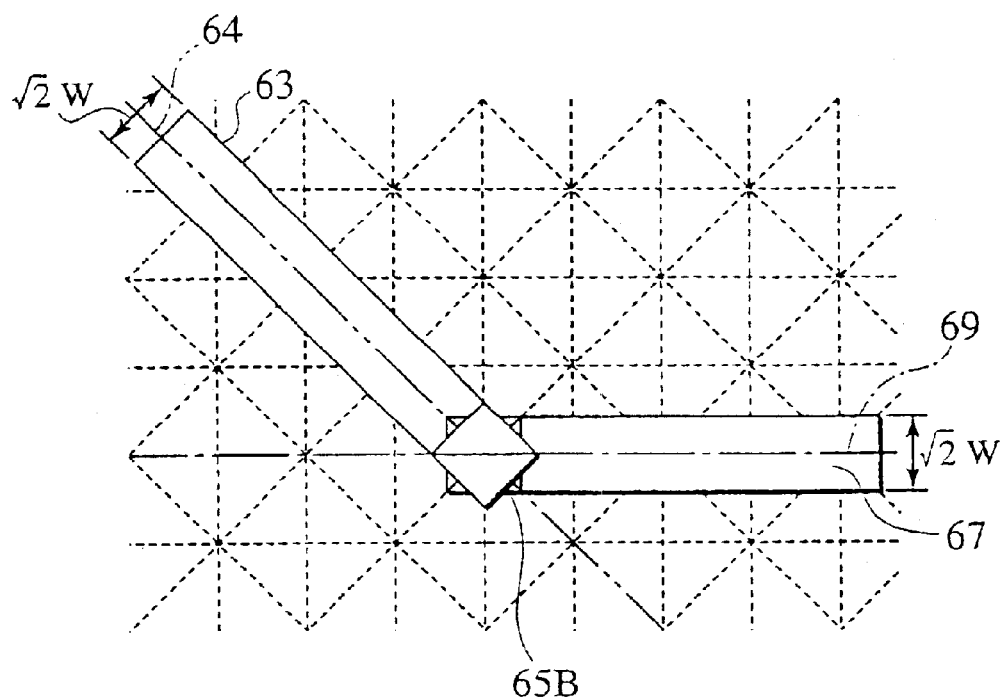
FIGS. 14A and 14B illustrate another example of terminal layout of connection of the two lines in the same layer using a different shape of turn-VIA.
Figure 14B:
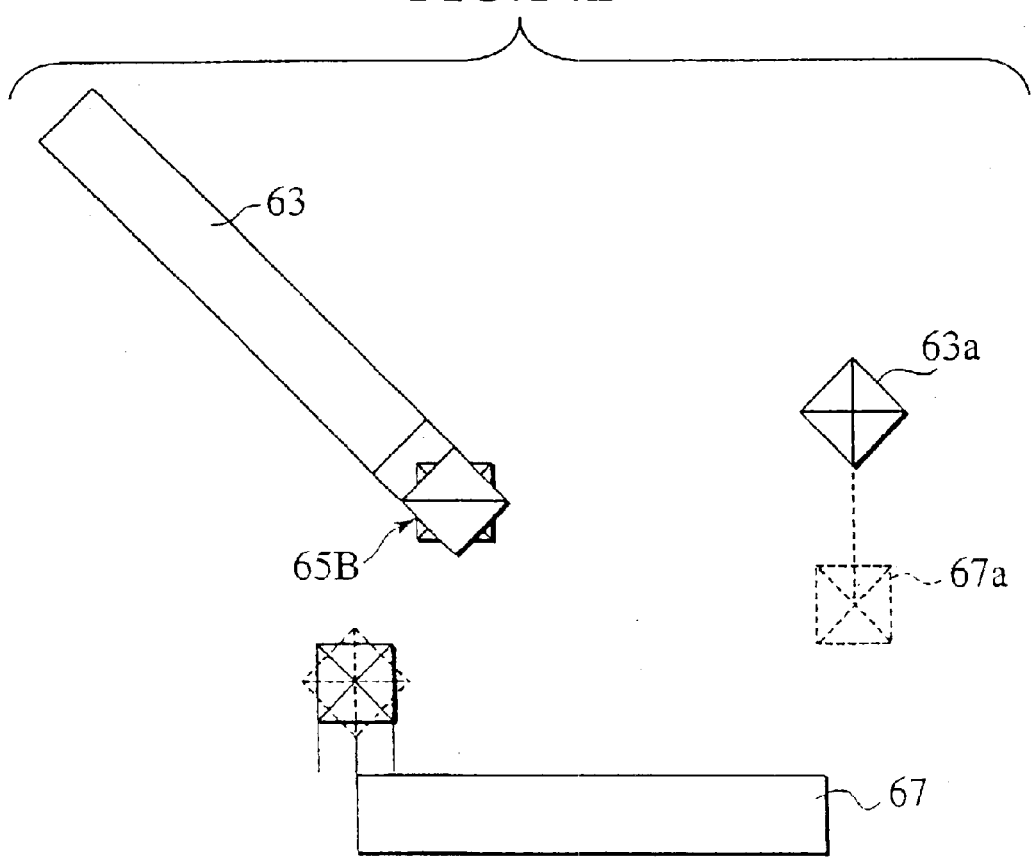

In FIGS. 14A and 14B, a horizontal line 67 with a width of $\sqrt{2}$ W is produced, and an oblique line 63 with the same width $\sqrt{2}$ W is produced. Then, a turn via 65B is placed at the intersection 68 of the center line 69 of the horizontal line 67 and the center line 64 of the oblique line 63. In this case, the turn via (or the plane connection pattern) 65B is a combination of two squares of the same size, one of which is rotated by 45 degrees with respect to the other. By placing the turn via 65B at the intersection of the two lines, the CAD can recognize that the two lines are to be physically connected in the same layer. The turn via 65B is produced using orthogonal lines only. Thus, the amount of data processing is small, and the terminal layout becomes simple.

<Seventh Embodiment>

The seventh embodiment illustrates how a semiconductor device having a three-dimensional oblique line structure is manufactured from a layout produced by the automatic layout design technique described above. To manufacture such a semiconductor device, a mask set is prepared from the layout.

Figure 15:
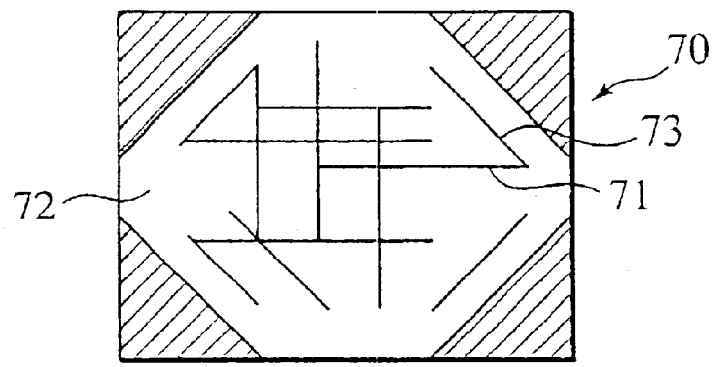
FIG. 15 is a schematic plane view of a part of a semiconductor integrated circuit manufactured from a circuit layout including the terminal layout of oblique lines according to the invention.

FIG. 15 is a schematic plan view of a cell 70, which is a part of a semiconductor integrated circuit, formed on a semiconductor substrate. An oblique line structure, in which oblique lines 73 and basic orthogonal lines (including horizontal lines 71) exist in a transistor region 72 of the cell 70, is schematically illustrated. The detailed line structure is omitted from this figure for the convenience of explanation.

Figure 16A:
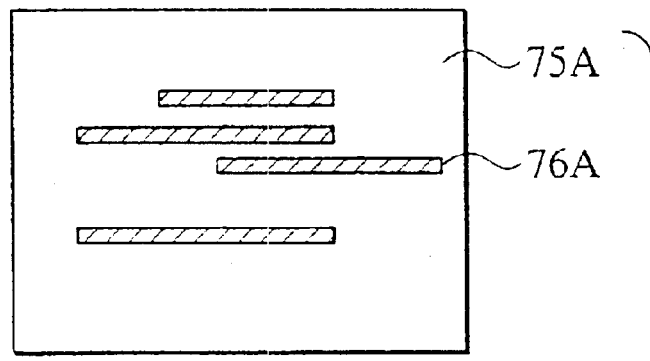
FIGS. 16A, 16B and 16C illustrate an exposure mask set manufactured from the oblique-line wiring layout produced by the automatic layout design according to the seventh embodiment of the invention.
Figure 16B:
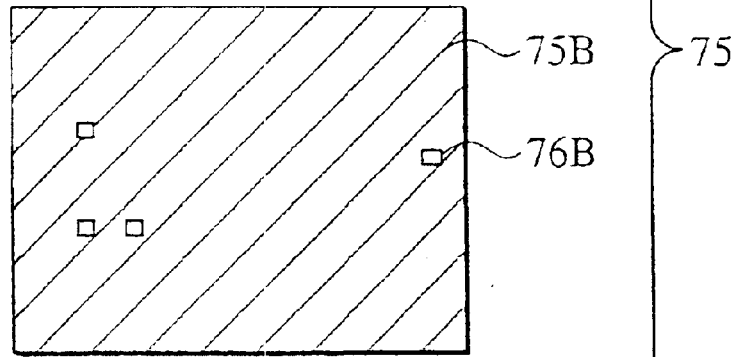

In order to realize the oblique line structure, the mask pattern layout data produced by the aforementioned automatic design technique is inputted to a pattern generator, such as an optical exposure device, an electron beam exposure device, and an X-ray exposure device. The layout data is used to print the line patterns onto reticles (that is, exposure masks). The number of reticles used to manufacture a semiconductor integrated circuit is from ten to several tens, or more, depending on the steps of the manufacturing process or the scale of the semiconductor. FIG. 16 illustrates three reticles, which is only a part of an actual reticle set. The three masks are referred to as a mask set 75, each mask shows only a part of patterns for the convenience sake.

Figure 16C:
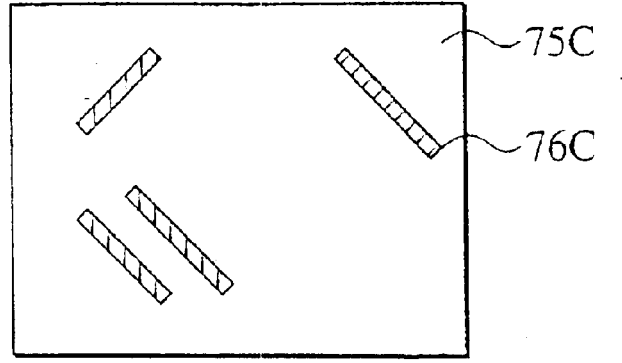

The mask set 75 includes a first mask 75A (FIG. 16A), a second mask 75B (FIG. 16B), and a third mask 75C (FIG. 16C). The first mask 75A has opaque line patterns (light-blocking region) 76A formed of, for example, a chromium (Cr) film on a, for example, a quartz mask substrate. The opaque line patterns correspond to horizontal lines of a first wiring layer. The second mask 75B has apertures (i.e., transparent regions) 76B, which become cut patterns of via holes. The third mask 75C has oblique line patterns (i.e., opaque regions) 76C that extend at an oblique angle (e.g., 45 degrees or 135 degrees) with respect to the first line patterns 76A. If the first, second, and third masks are superimposed, the terminal ends of the oblique line patterns 76C and the terminal ends of the horizontal line patterns 75A are aligned with the cut patterns 76B.

The three-dimensional oblique line structure illustrated in FIG. 15 is achieved using a series of reticles that includes the mask set 75 shown in FIG. 16. It is needless to say that various other masks are required to for transistors or other interconnections of a semiconductor integrated. However, explanation for other masks will be omitted.

Figure 17:
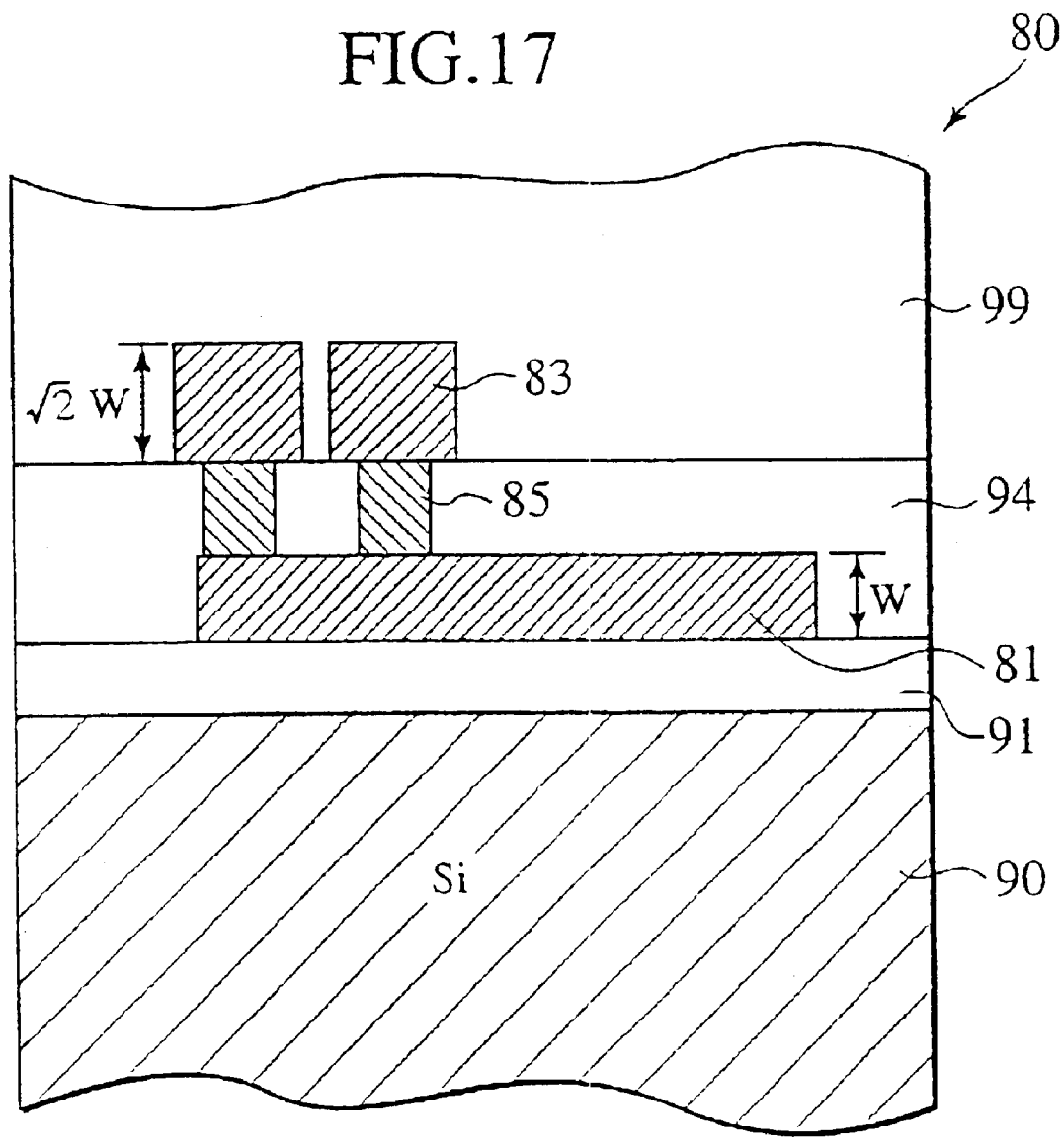
FIG. 17 is a cross-sectional view of a semiconductor device having an oblique line multi-layered structure.

FIG. 17 is a schematic sectional view of a part of a semiconductor integrated circuit with an oblique line structure 80. The oblique line structure 80 comprises basic orthogonal lines 81 extending in the horizontal or the vertical direction on the first insulating layer on the silicon (Si) substrate 90, and oblique lines 83 located above the basic orthogonal lines via the second insulating layer 94. The oblique lines 83 extend at an angle of 45 degrees or 135 degrees with respect to the orthogonal lines 81. Via-contacts 85 connect the orthogonal lines and the oblique lines at their end portions or the intersections. The horizontal cross-section of each via-contact is a square whose two facing sides are along the longitudinal edges of the narrower line, either the oblique line or the orthogonal line (the latter one in the example shown in FIG. 17). The oblique lines 83 are covered with a passivation layer or the third insulating layer 99.

The via-contact 85 is made of a conductive material, such as tungsten (W), filled in a via-hole formed based on the layout designed by the automatic design method of the present invention. An upper oblique line 83 and a lower orthogonal line 81 are connected by one or more via-contacts 85 inside the overlapped area of these two lines. One of the via-contacts 85 is located at the intersection of the center line of the oblique line 83 and the center line of the orthogonal line 81.

Although only the first through third insulating layers are shown in FIG. 17 for the convenience sake, there may be other insulating layers and lower wiring layers.

FIG. 18 illustrates the steps of fabricating the oblique line structure 80 shown in FIG. 17 using the mask set 75 illustrated in FIG. 16.

Figure 18A:
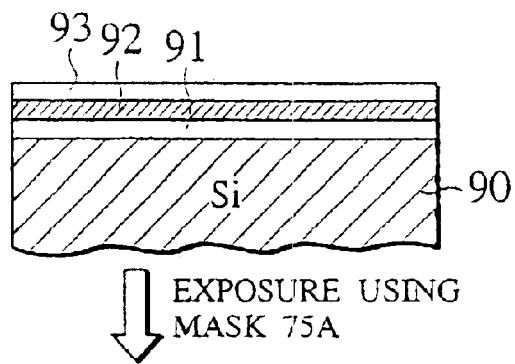
FIGS. 18A, 18B, 18C, 18D, 18E, 18F, 18G, and 18H illustrate the manufacturing process of the semiconductor device shown in FIG. 17.

(A) A first metal film 92, such as Al alloy, is deposited on a silicon substrate 90 covered with an insulation film (e.g., oxide film, such as $SiO_2$) 91 by sputtering or vacuum evaporation, as shown in FIG. 18A. The first metal film 92 is covered with a positive photoresist 93 by spin coating.

Figure 18B:
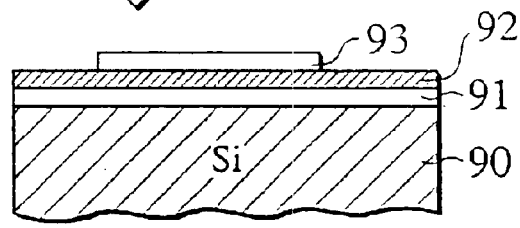

(B) Then, the silicon substrate 90 is placed on the exposure stage of an exposure apparatus, such as a stepper, to illuminate the positive photoresist 93 via the first mask 75A having orthogonal line patterns. After the exposure, a portion of the photoresist 93 that corresponds to the orthogonal line patterns remains, as shown in FIG. 18B.

Figure 18C:
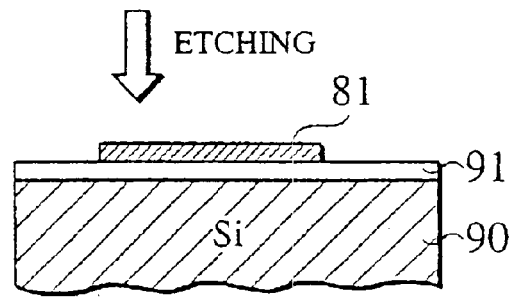

(C) The first metal film 92 is etched by, for example, reactive ion etching (RIE) using the photoresist pattern as a mask. The photoresist 93 is removed after the etching, and the orthogonal metal lines 81 are formed, as shown in FIG. 18C.

Figure 18D:
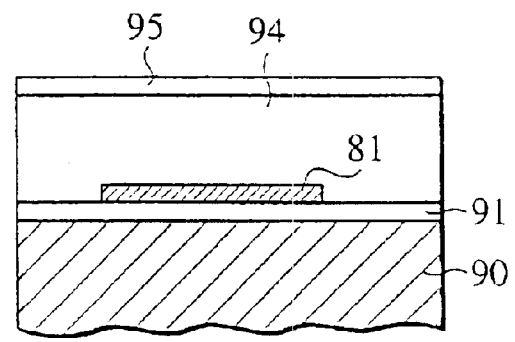

(D) Then, the second insulation layer, such as an oxide film, PSG, or BPSG, is deposited over the orthogonal lines 81 by a CDV method or the like. The second inter-layered insulation film 94 is covered with a positive photoresist 95, as shown in FIG. 18D. If a negative photoresist is used instead of the positive photoresist, the opaque and transparent patterns are inverted on the second mask 75B.

Figure 18E:
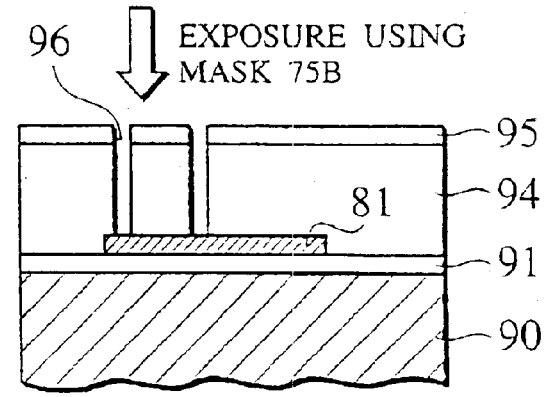

(E) Again, the silicon substrate 90 is placed onto the exposure stage of the exposure apparatus to expose the photoresist 95 into the cut pattern of the second mask 75B. The opening pattern of the cut is a square whose facing sides are along the longitudinal edge of the narrower line, either the oblique line or the orthogonal line. The second insulating layer 94 is then etched to form via-holes 96 using the remaining photoresist as a mask until the etching bottom reaches the orthogonal line 81, as shown in FIG. 18E.

Figure 18F:
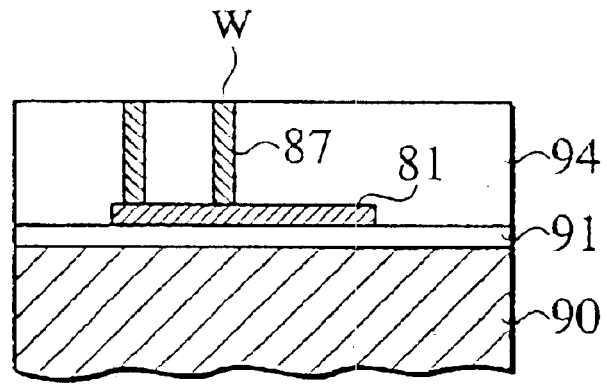

(F) Then, the positive photoresist 95 is removed, and the via-holes 96 are filled with a conductive material (e.g., tungsten (W)) by CVD, sputtering, or vacuum evaporation. Then, the surface is flattened by, for example, chemical and mechanical polishing (CMP) as shown in FIG. 18F.

Figure 18G:
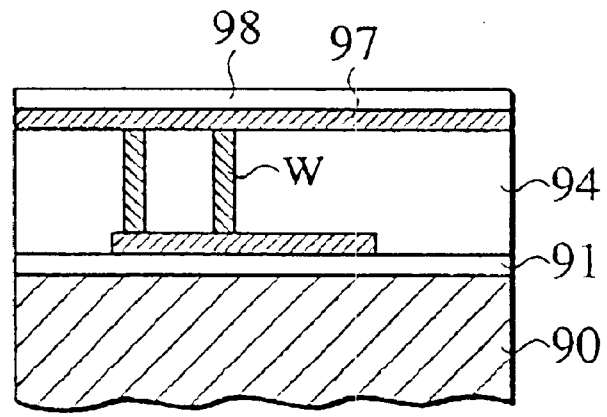

(G) The second metal film 97, such as Al alloy, is formed on the second insulation layer 94 by sputtering or vacuum evaporation, and a positive photoresist 98 is deposited on the second metal film 97 by spin coating, as shown in FIG. 18G.

Figure 18H:
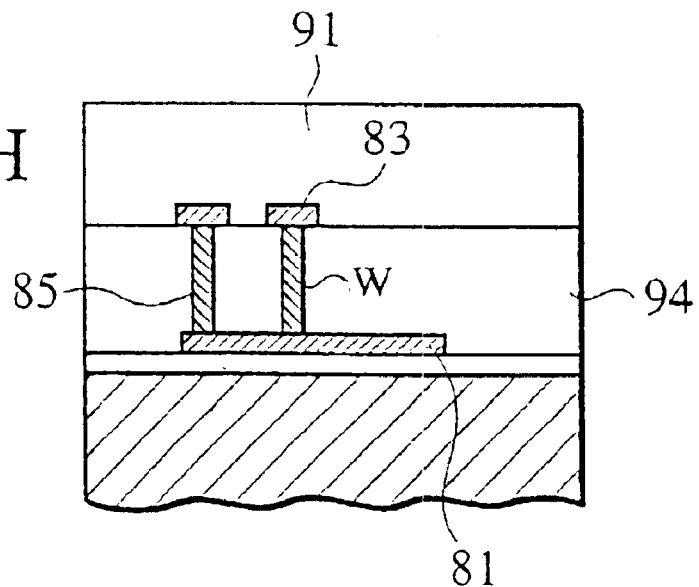

(H) The oblique line patterns are projected on the photoresist 98 using the third mask 75C and the exposure apparatus, and the exposed patterns are developed. Only a portion of the photoresist corresponding to the oblique line patterns remains. The second metal film 97 is etched by RIE using the remaining photoresist as a mask, and the oblique line structure 80 is completed, as shown in FIG. 18H. Then, a passivation film (or the third inter-layered insulation film) 91, such as oxide film, PSG, BPSC, nitride film ($Si_3N_4$) or polyimide film, is deposited on the oblique line structure 80 by CVD.

In the foregoing description, only the first metal film 81 and second metal film 97 are connected by via-contacts. However, it is needless to say that there may be three-dimensional connection structures, for example, connection between a third metal film and a fourth metal film located in different wiring layers. Alternatively, there may be another wiring layer below the first metal film 81, which are connected to the orthogonal line patterns by via-contacts.

Although the semiconductor integrated circuit is manufactured using the mask set in the above-described example, the line patterns may be printed directly onto the wafer without using the mask set. In this case, the line patterns are written by scanning, for example, an electron beam based on the layout data of the automatic layout design.

It is readily understand from the spirit of the invention that at least one of the first metal film 81 and second metal film 97 may not be made of Al allow. In this case, either or both metal films may be made of copper (Cu), and Damascene wiring structures may be employed.

<Eighth Embodiment>

Figure 19:
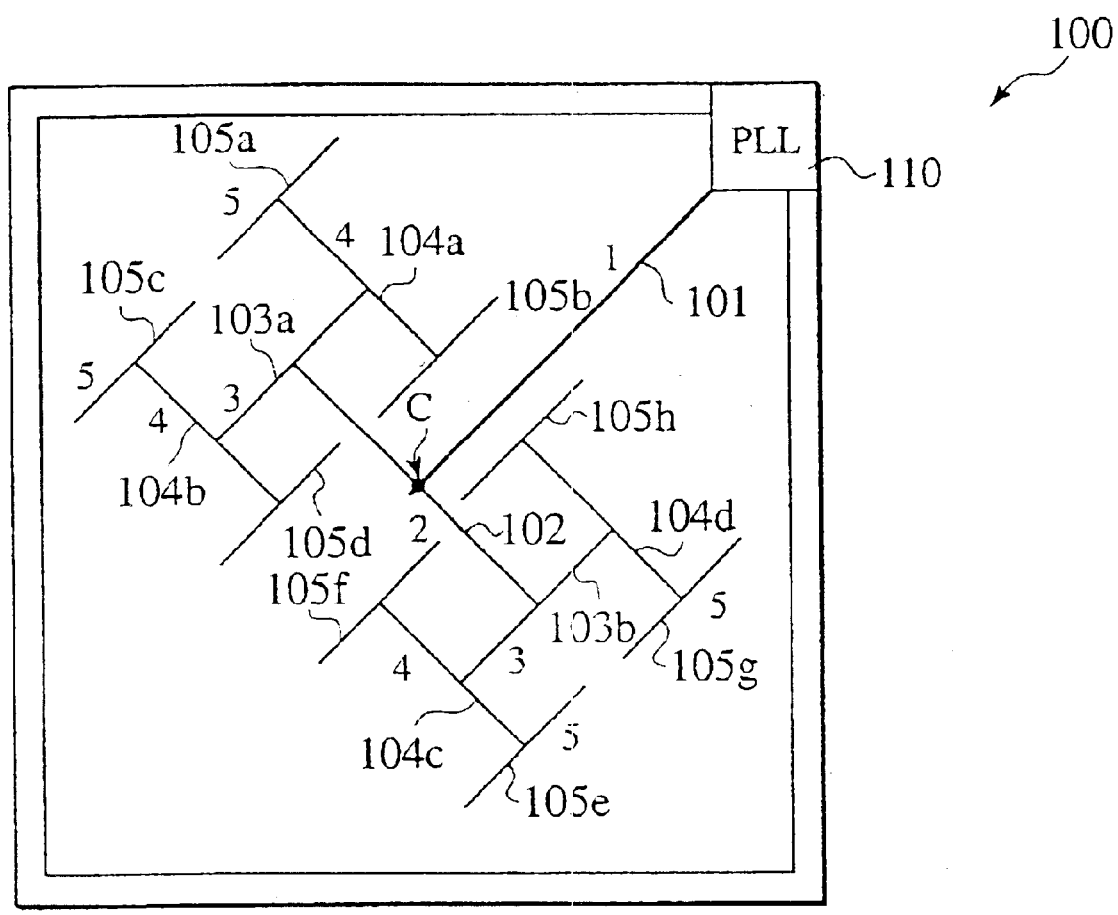
FIG. 19 illustrates a layout of a semiconductor integrated circuit with a clock-tree structure of oblique lines according to the eighth embodiment of the invention.

FIG. 19 illustrates a semiconductor integrated circuit 100 having a clock tree composed of oblique lines.

The semiconductor integrated circuit 100 comprises a PLL (phase locked loop) 110 positioned at a corner of the chip, and a main clock line 101 extending obliquely from the PLL at an angle of 45 degrees with respect to the orthogonal coordinate axes of the chip. The main clock line 101 terminates at or near the center of the chip. A clock tree branches off symmetrically from the terminal end C of the main clock line into oblique directions at an angle of 45 degrees or 135 degrees with respect to the orthogonal coordinate axes. In FIG. 19, the bold numbers 1 through 5 represent the branching hierarchy of the clock tree.

To be more precise, the oblique line 102 of the second branching hierarchy extends symmetrically from the terminal end C of the main clock line 101 in a direction perpendicular to the main clock line 101. From both ends of the oblique line 102, oblique lines 103a and 103b of the third branching hierarchy extend again symmetrically with respect to the terminal end C of the main clock line 101. From both ends of the oblique lines 103a and 103b, oblique lines 104a through 104d of the fourth branching hierarchy extend symmetrically with respect to the main clock line 101. In this manner, as the branching hierarchy lowers, each line branches off symmetrically with respect to the main clock line.

By employing the branching structure, a clock tree consisting of oblique lines is spread symmetrically with respect to the center C of the chip. Although not shown, a basic orthogonal line patterns are formed below the clock tree. The end portions of the oblique lines of the tree are connected to the end portions or the intersections of the orthogonal lines of the lower layer through via-contacts according to the terminal layout generated by the automatic design method of the invention.

In the clock tree employing oblique lines only, in principle, the lines in the same branching hierarchy always belong to the same layer. Therefore, the four oblique lines 104a through 104b in the fourth branching hierarchy belong to the same layer. Those lines that belong to different hierarchies, but extend in the same direction may be located in the same layer, or alternatively, they may be located in different layer. For example, the oblique lines 103 in the third branching hierarchy and the oblique lines 105 in the fifth hierarchy in FIG. 19 may be located in the same layer because they all extend in the same direction.

The most significant effect of using the oblique lines resides in that balances in circuit design, such as load capacitance, are easily computed. In addition, variations in clock delay due to process fluctuation can be reduced. Since the lines in the same branching hierarchy are arranged in the same layer so as to be symmetrical, variations among different wiring layers are eliminated. Pulses are supplied through symmetrical shorter paths, clock delay between two arbitrary points is reduced, while balancing the load capacitance for each branch.

Although not clearly shown in the figure, as the branching hierarchy lowers, the line width is narrowed based on the Elmore's wiring delay computation formula. The current density flowing through the interconnection becomes small as branching proceeds. Accordingly, the line width can be narrowed within the range not exceeding the acceptable value of the current density of the metal line.

The clock tree structure of oblique lines can realize a high-performance integrated circuit with less load capacitance and variation.

<Ninth Embodiment>

Figure 20:
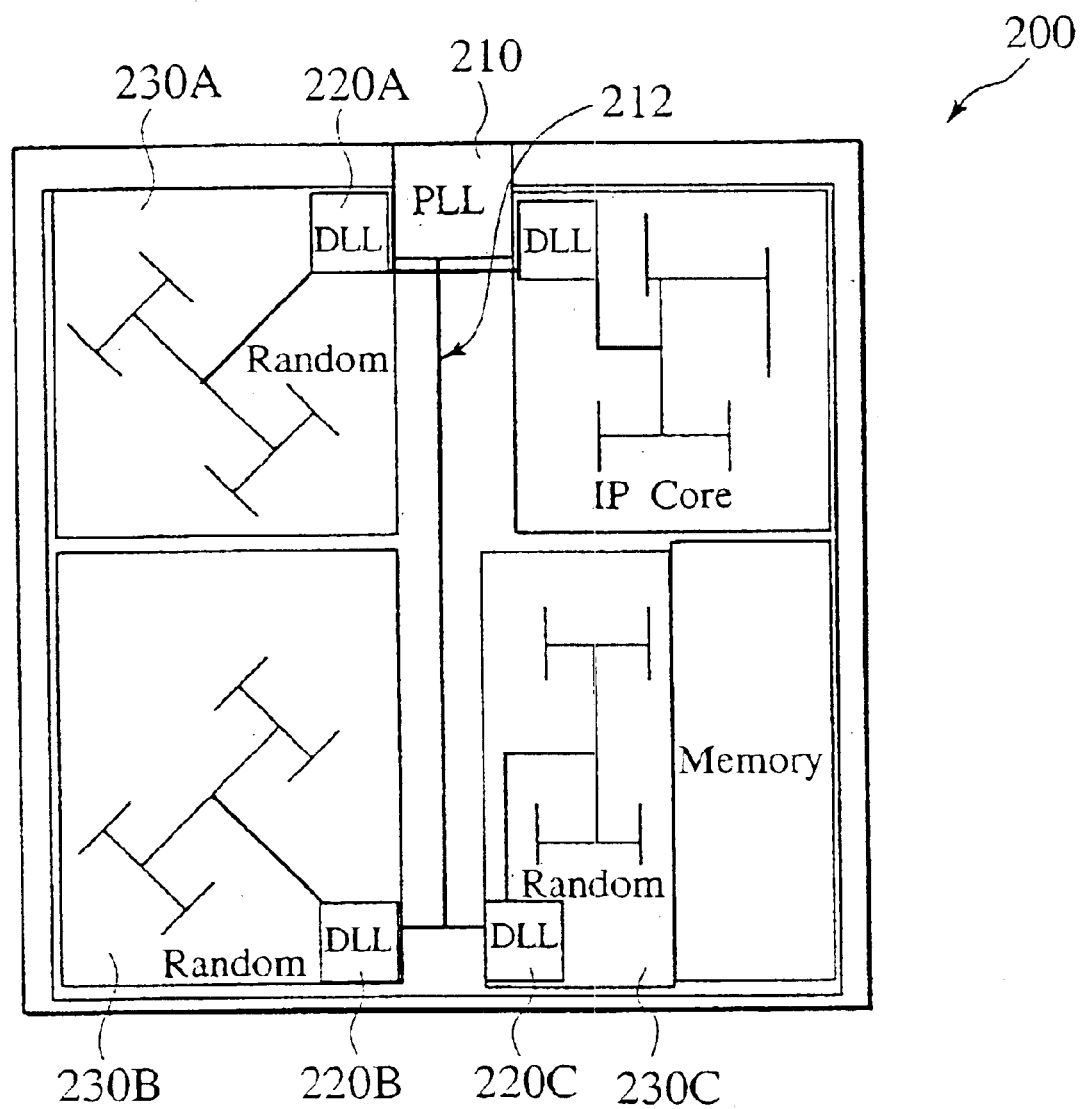
FIG. 20 illustrates a layout of an LSI consisting of multiple blocks, each block having a clock-tree structure according to the ninth embodiment of the invention.

FIG. 20 illustrates a layout of a part of an LSI, to which the clock tree illustrated in the eighth embodiment is applied. The integrated circuit 200 comprises a main PLL 210 positioned at an end of the circuit, a global clock line 212 extending from the main PLL 210, and a plurality of random blocks 230A to 230C. The main PLL 210 supplies a global clock of a comparatively low frequency (some hundreds MHz). Each random block 230 includes a clock driver cell connected to the global clock line 212, and a clock tree composed of oblique lines. The clock driver cell is a DLL (delay-locked loop) 220 in the eighth embodiment.

The main PPL 210 adjusts the phases of clocks between the integrated circuit 200 and other integrated circuits (not shown). A global clock, which is a basic clock for the overall chip, is supplied to a circuit block or a random block inside the chip. A random block is a set of partial circuits including multiple logical circuit modules designed by, for example, an engineer, in a dividing manner. The DLL 220 provided in each random block converts a global clock of a comparatively low frequency into a local clock of a high frequency (several GHz), and supplies the high-frequency clock inside of the random block via the associated clock tree.

Although not shown in FIG. 20, the clock tree of each block 230 is connected to the basic orthogonal lines in a lower layer by via-contacts. In other words, the terminal ends of the oblique lines configuring the clock tree are securely connected to the terminal end of the basic orthogonal lines by the via-contacts based on the layout produced by the automatic design method.

As has already been described, as the LSI becomes finer, the wiring delay is greatly affected by the wiring resistance and capacitance. With a conventional collective synchronizing design (i,e., a single clock design), a pulse rate of several hundreds MHz is the upper limit for synchronizing a chip of 10 mm square. If a higher rate is desired, the thickness of the clock lines must be increased to some tens to some hundreds times of a standard signal line. The manufacture process of such thick lines is difficult, and it is difficult to handle such thick lines on CAD.

To overcome this problem, a global clock is fed at a comparatively low frequency, and is converted into a high frequency for each random block. The local blocks are synchronized with one another by the high frequency signal. This arrangement allows faster operation in a chip of a conventional size. In addition, by using a clock tree consisting of symmetrical oblique lines, a delay is reduced.

In the configuration shown in FIG. 20, random blocks 230 are disposed on both sides of the global clock line 212. Accordingly, the DLL of each random block 230 can be positioned along the periphery of the circuit, which allows a voltage to be supplied easily.

Figure 21:
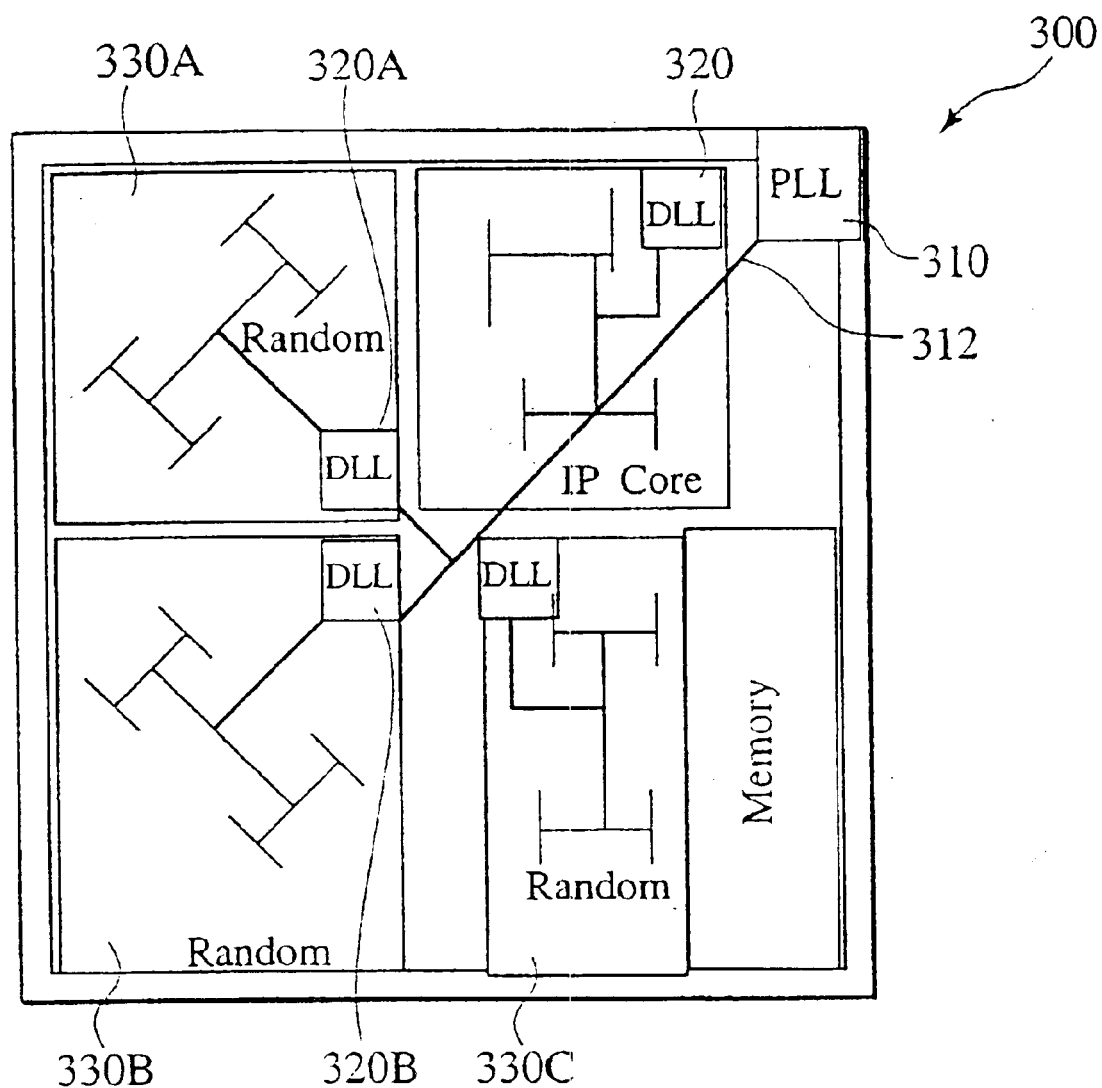
FIG. 21 illustrates another layout of the LSI shown in FIG. 20.

FIG. 21 illustrates a modification of the semiconductor integrated circuit of FIG. 20. In a semiconductor integrated circuit 300, a PLL 310 is positioned at a corner of the circuit, and a global clock line 312 for supplying a global clock is arranged obliquely. In general, a delay is likely to be caused among global clock lines for supplying a global clock. The configuration shown in FIG. 21 is advantageous in that the delay cased in the global clock line is reduced because of its oblique arrangement. In addition, the DLLs 320 of the random blocks are gathered around the end of the global clock line 312 in order to supply the global clock to the respective random blocks 330 at a high speed almost simultaneously. A power is supplied to each DDL from a dedicated pad (not shown) attached to the top face of the chip.

By arranging the global clock line 312 obliquely, the frequency of the global clock itself can be increased. This achieves a faster circuit operation.

<Tenth Embodiment>

Figure 22:
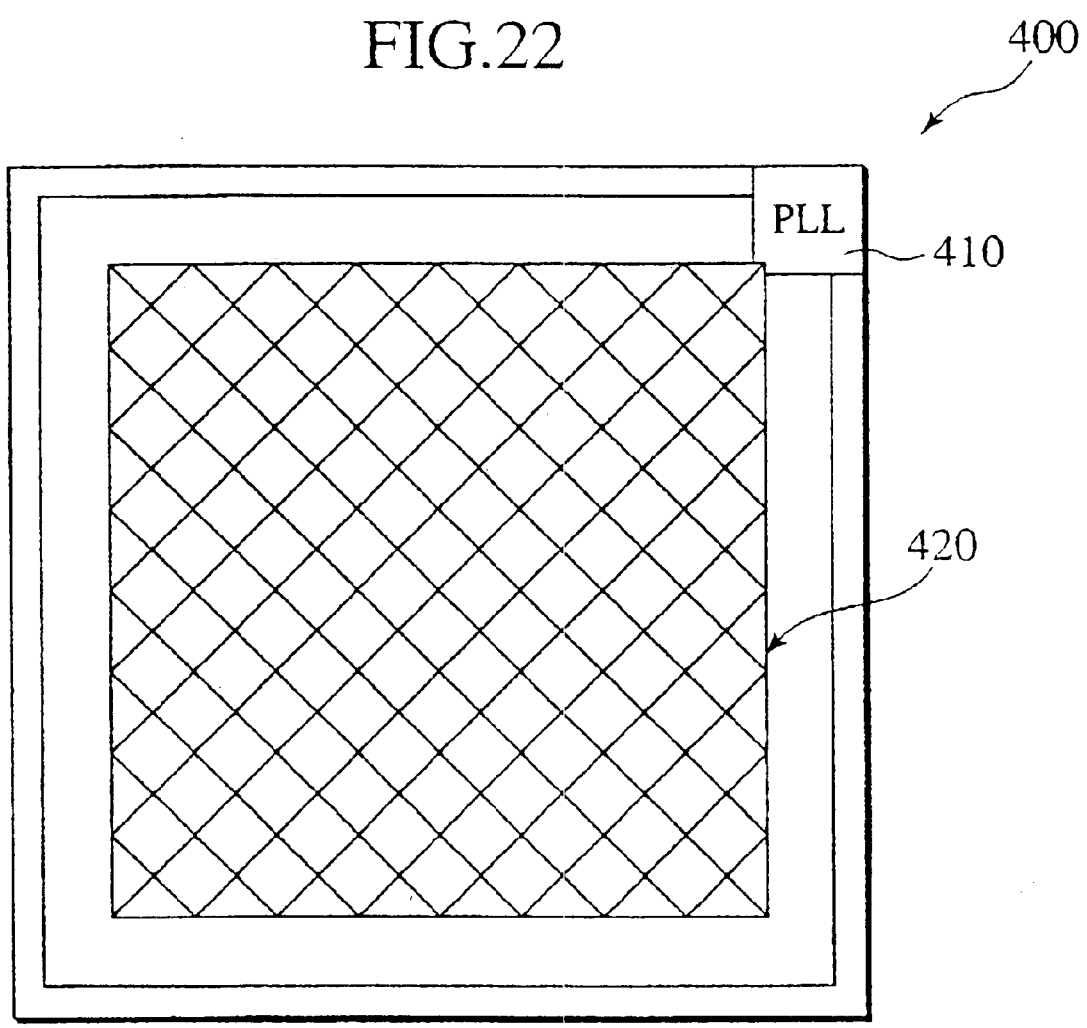
FIG. 22 illustrates a layout of a semiconductor integrated circuit having a clock mesh of oblique lines according to the tenth embodiment of the invention.

FIG. 22 shows an example of a semiconductor integrated circuit that has a clock mesh of oblique lines. A semiconductor integrated circuit 400 comprises a PLL 410 positioned at a corner of a chip, and a clock mesh 420 consisting of oblique lines. The clock mesh is arranged almost over the chip.

In general, clock supply lines in a mesh structure have less process variations. Accordingly, variations due to a delay can also be reduced over the entire region of the circuit. Because the clock mesh of oblique lines is used in the tenth embodiment, the clock delay is further reduced, as compared with a conventional clock mesh consisting of horizontal and vertical lines.

Although not shown, a basic orthogonal wiring layer that is connected directly to the cell may be located below the clock mesh of the oblique lines. The end portions of the orthogonal lines are connected to the oblique lines of the clock mesh by via-contact according to the layout produced by the automatic layout design of the invention.

<Eleventh Embodiment>

Figure 23:
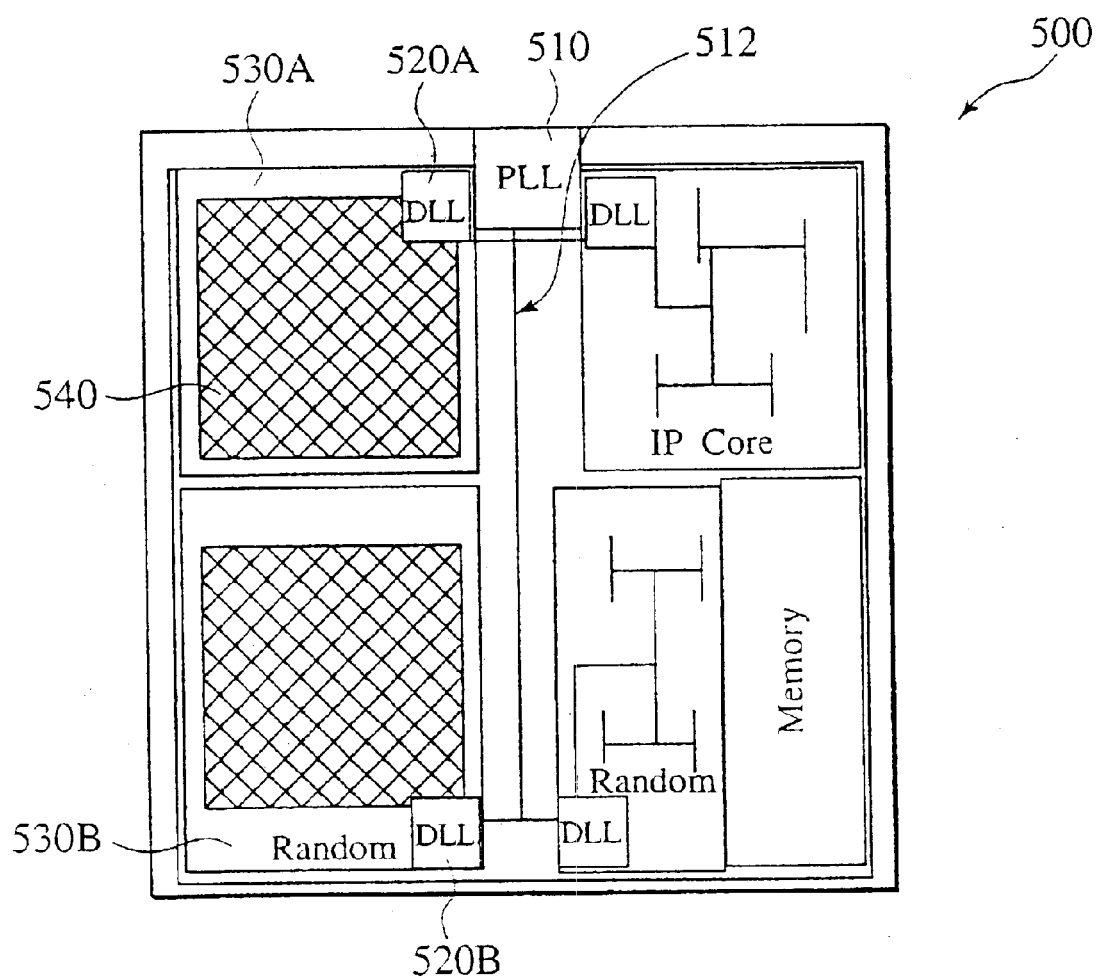
FIG. 23 illustrates a layout of an LSI consisting of multiple blocks according to the eleventh embodiment of the invention, some of which use the clock mesh of oblique lines shown in FIG. 22.

FIG. 23 illustrates a part of an LSI, to which clock mesh shown in FIG. 22 is applied. A semiconductor integrated circuit 500 comprises a main PLL 510 positioned along the periphery of the circuit, a global clock line 512 extending from the main PLL 510, and a plurality of random blocks 530. The global clock line 512 supplies a global clock at a comparatively low frequency (e.g., some hundreds MHz). Each random block 530 has a clock driver cell (DLL in the eleventh embodiment) 520 connected to the global clock line 512, and an oblique clock mesh 540 of oblique lines. The DLL 520 converts a global clock of a comparatively low frequency into a high-frequency (several GHz) local clock, and supplies the high-frequency local clock inside the random block via the associated clock mesh 540.

Although not shown, a basic orthogonal wiring layer may be furnished below the clock mesh 540 in each random block 530. The end portions of the orthogonal lines of the lower layer are connected to the cell by via-contact fabricated from the terminal layout produced by the automatic design method of the invention.

In each block 530, the DLL 520 synchronizes a supplied global clock with the clocks in the other blocks at a high frequency. A high-frequency signal is supplied from the DLL 520 to each site via the oblique clock mesh that has little delay variation. This arrangement allows a fast operation of the circuit.

The vertical global clock supply line 512 may be run obliquely across the chip, as in the example shown in FIG. 21. In this case, the frequency of the global clock itself can be increased, which results in faster operation of the circuit.

<Twelfth Embodiment>

Figure 24:
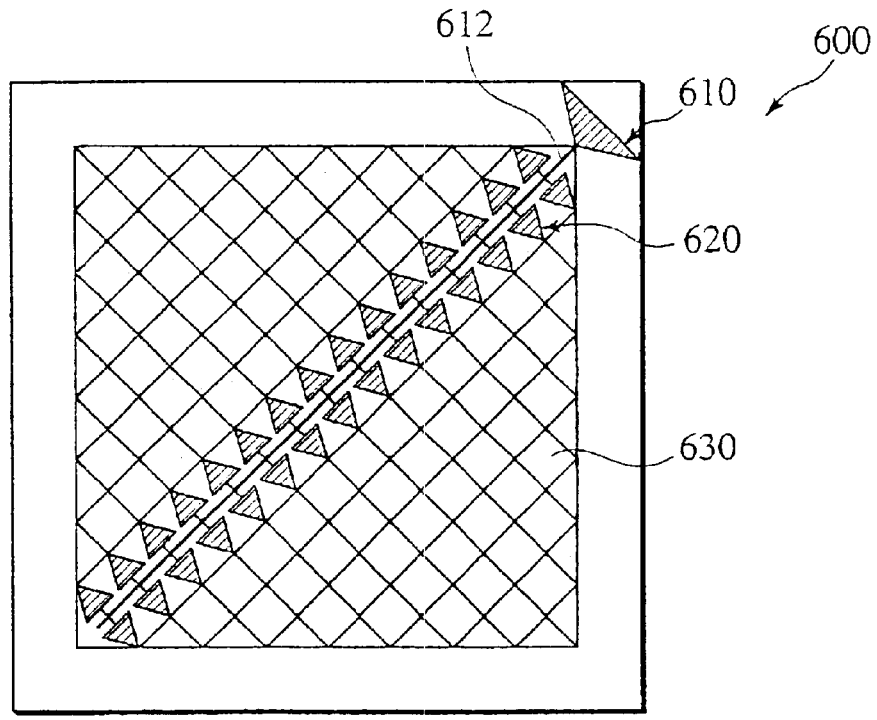
FIG. 24 illustrates a layout of a semiconductor integrated circuit using a clock mesh of oblique lines according to the twelfth embodiment of the invention.

FIG. 24 illustrates still another example of a semiconductor integrated circuit using a clock mesh. A semiconductor integrated circuit 600 comprises a route driver 610 positioned at a corner of the chip, a main clock supply line 612 extending obliquely from the route driver 610 across the chip, and a clock mesh 630 covering the entire area of the chip. Multiple sub-drivers 620 are connected to the main clock supply line 612. The main clock supply line 612 has a comparatively large driving force. The sub-drivers 620 drive the oblique lines that form the clock mesh 630.

Because the sub-drivers 620 activate the associated oblique signal lines, a skew of the clock signal, which is the most problematic in a logical LSI, can be reduced. Variation in the manufacturing process is also reduced.

<Thirteenth Embodiment>

Figure 25:
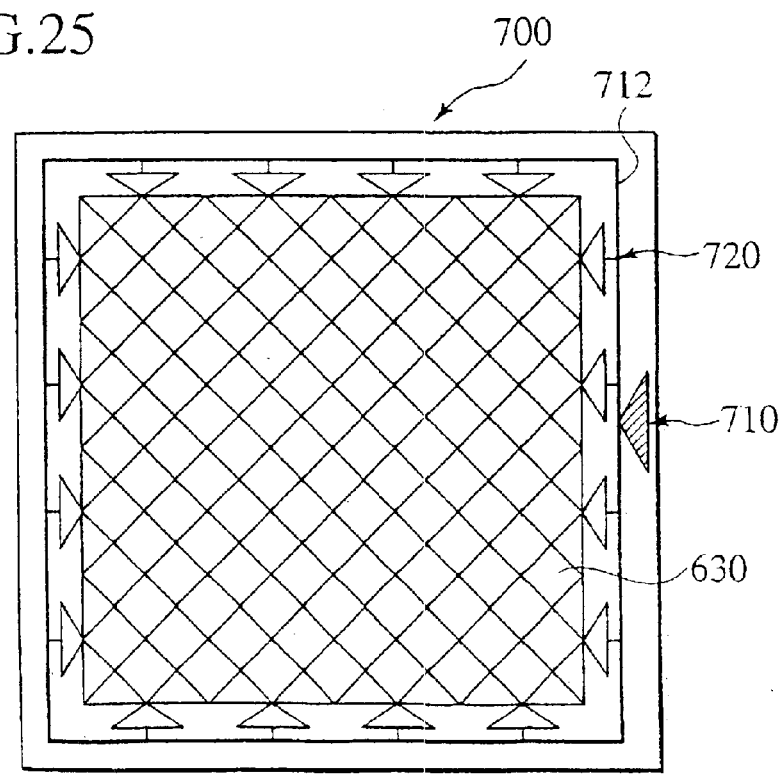
FIG. 25 illustrates a layout of a semiconductor integrated circuit using a clock mesh of oblique lines according to the thirteenth embodiment of the invention.

FIG. 25 shows still another example of a semiconductor integrated circuit employing a clock mesh structure. A semiconductor integrated circuit 700 comprises a route driver 710 positioned near the edge of the circuit, a main clock supply line 712 extending from the route driver 710 along the periphery of the circuit, and a clock mesh 730 spread over the circuit. Multiple sub-drivers 720 are connected to the main clock supply line 712. The root driver 710 has a comparatively large driving force. The sub-drivers drive the associated oblique lines of the clock mesh 630.

The feature of the semiconductor integrated circuit 700 is that the sub-drivers 720 are arranged along the periphery of the circuit. In the example shown in FIG. 24, the sub-drivers 620 that can be a source of noise are disposed deep inside the circuit. In contrast, the noise sources are placed along the periphery of the circuit in the thirteenth embodiment. This arrangement is unlikely to cause a voltage drop. Since a voltage drop causes a difference in performance between the center and the periphery of the circuit. To this end, the configuration shown in FIG. 25 is superior in achieving a uniform performance.

<Fourteenth Embodiment>

Figure 26:
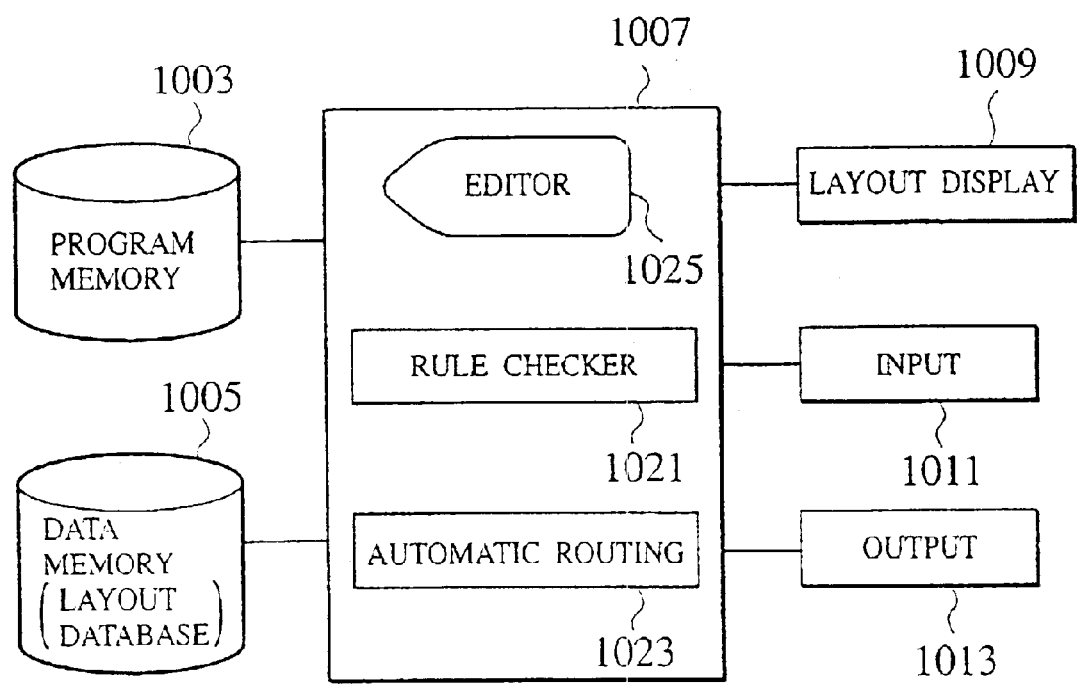
FIG. 26 a block diagram of an automatic layout system carrying out the automatic layout design method of the invention.

FIG 26 is a schematic block diagram of an automatic design apparatus that carries out the automatic design method according to the invention. An automatic design apparatus 1000 comprises a program database 1003 for storing an automatic design program, a layout database 1005 for storing layout data, a process controller 1007 for controlling the data processing of the automatic layout design. The apparatus also has a layout display 1009 for displaying a layout produced by the automatic design apparatus, an input device 1011 for inputting patterns or and figures, and an output device 1013 for output the layout produced by automatic design apparatus.

The process controller 1007 includes a rule checker 1021 for checking the design rules and the electrical rules, an automatic routing 1023 for automatically selecting a signal-transfer path and a bypass route of layout data; and a graphic editor 1025 for editing the produced layout.

The layout database 1005 stores circuit diagrams that have already been produced, and a variety of lines and connection patterns of various widths and shapes.

The program database 1003 stores a program for automatically designing a layout. The program allows the automatic design apparatus to produce a wiring layout on a two-dimensional plane, and defining connection patterns at desired positions for connecting wiring patterns of different layers or the same layer. This program may be temporarily stored in a magnetic disk, an optical disk, a magneto-optical disk, or a magnetic tape (specifically, floppy disks, CD-ROMs, MO disks, or cassette tapes) before it is stored in the program database 1005.

The automatic design program includes at least the following steps:

(1) causing the process controller 1007 to produce a first line with a first line width extending in a predetermined direction, and a second line with a second line width extending at an oblique angle with respect to the first line;

(2) causing the process controller 1007 to detect an overlapped area between the end portions of the first and second lines, and to detect the intersection of the center line of the first line and the center line of the second line; and (3) causing the process controller 1007 to read a connection pattern from the layout database 1005 according to the shape of the detected overlapped area, and to place the connection pattern at the intersection.

Figure 27:
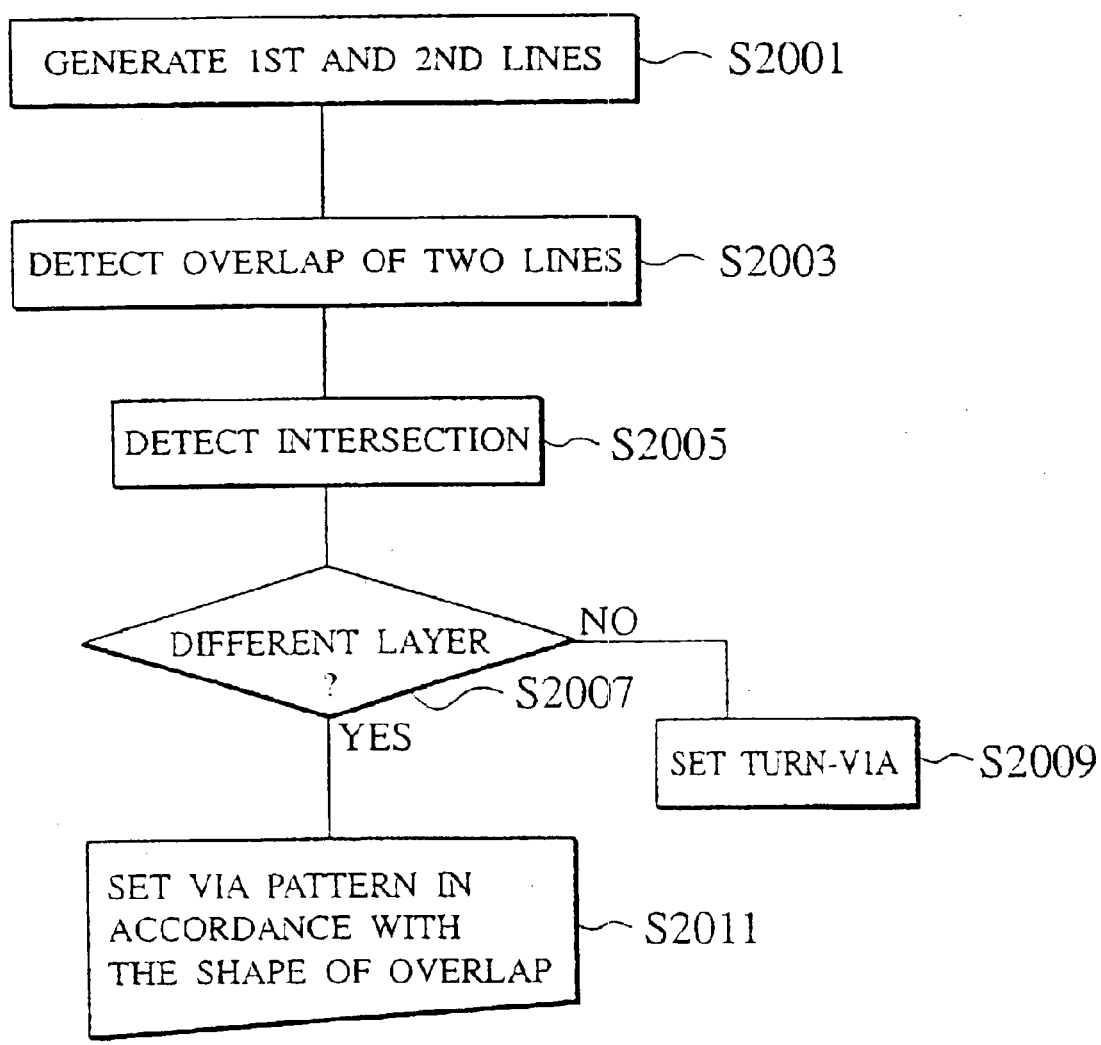
FIG. 27 illustrates an operation flow of a program for executing the automatic layout design installed in the system shown in FIG. 26.

FIG. 27 is a flow chart of terminal processing of two lines to be connected, that is carried out by the automatic design apparatus based on the program stored in the program database 1003.

In step S2001, first and second lines are produced based on the information inputted from the input unit 1011 shown in FIG. 26. The first line extends, for example, along the basic orthogonal coordinate axes. The second line extends at an oblique angle with respect to the first line. In step S2003, the process controller 1007 detects an overlapped area of the end portions of the first and second. In step S2005, the intersection of the center line of the first line and the center line of the second line is detected inside the overlapped area.

In step S2007, it is determined whether or not the first and second lines are located in different layers based on the information inputted from the input unit 1011. If NO in step S2007 (that is, if the first and second lines are in the same layer), the process proceeds to step S2009, in which a turn VIA is placed at the intersection in the overlapped area. This indicates that the first and second lines are connected to each other in the same layer. If YES in step S2007, the process jumps to step S2011, and a connection pattern is selected in accordance with the shape of the overlapped area, and placed at the intersection in the overlapped area.

For example, if the detected overlapped area is a rectangular region located at the terminal end of two lines with the minimum width, a standard via is read from the layout database 1005, and set at the intersection. If the detected overlapped area is a parallelogram or a quadrangle having an oblique side located at the terminal end of two lines with the minimum width, then a connection pattern of parallelogram is read out of the layout database 1005, and placed at the intersection. Such parallelogramic connection pattern is generated in advance, and stored in the data. If the first and second lines are wide lines, an assembled connection pattern may be read according to the shape of the overlapped area.

A square standard via and an assembled via having a set of standard cuts are patterns formed of a combination of orthogonal lines only. When using these patterns, the amount of data is small, and therefore, the readout time and writing time are reduced.

Although not shown in the flowchart, it may be determined whether or not there is a request for deletion of an unnecessary projection coming out of the overlapped area after step S2003. If a request for deletion occurs, the unnecessary projection is deleted.

The layout data including oblique lines processed by the automatic design program is monitored on the layout display 1009. The layout data is inputted to a pattern generator, which creates a mask pattern for each layer based on the layout data. By using a mask set consisting of a predetermined number of the masks (or reticles), a semiconductor integrated circuit is fabricated by photolithography using an exposure apparatus, such as a stepper.

In the foregoing, although the present invention has been described with reference to the accompanying drawings by way of preferred embodiments, the present invention is not limited to the preferred embodiments. Some of these preferred embodiments may be combined as necessary. In particular, wiring structures using a variety of layout data illustrated in the first through sixth embodiments can be applied to the wiring structure of the semiconductor integrated circuit described in the seventh embodiment.

In addition, arrangement of random blocks and the positions of the DLLs in the semiconductor integrated circuit may be changed arbitrarily as long as the frequency of the global clock can be converted into a high frequency.

With the automatic design method for a terminal layout, most lines in the same layer can be generated using orthogonal data, and an amount of data is reduced.

The amount of computation on CAD is also reduced, and the design rule is easily verified.

Most part of the mask patters of the mask set of the present invention is generated from the orthogonal data, which improves alignment of patterns in different layers.

The semiconductor integrated circuit having an oblique line structure can reduce a wiring delay efficiently.

The semiconductor integrated circuit of the present invention supplies a clock via a clock-supply structure of oblique lines. The clock signal supplied through the oblique line structure is hardly affected by the variation in process or capacitance among different layers. Consequently, a skew of the clock signal is reduced.

With the semiconductor integrated circuit of the present invention, the frequency of a global clock itself, which is generally driven at a comparatively low frequency, can be increased. The low-frequency global clock is converted into a high frequency local clock, and the local clock is supplied throughout the block via a clock supply network formed by oblique lines. Under this arrangement, a delay of the entire circuit can be significantly reduced.

A recording medium containing the automatic design program of the present invention enables a CAD to process a terminal layout of connection between an oblique line and an orthogonal line at a high efficiency.

There are many modifications and substitutions within the spirit and the scope of the invention, which is defined by the appended claims.

What is claimed is:

1. A semiconductor integrated circuit comprising:
a phase-locked loop circuit located at a corner of a chip;
a main clock supply line extending obliquely with respect to a basic orthogonal coordinate axis of the chip and terminating at or near the center of the chip; and
a clock tree extending from the end of the main clock supply line, the clock tree comprising clock lines that symmetrically branch off in oblique directions with respect to the basic orthogonal coordinate axis.

2. The semiconductor integrated circuit of claim 1, wherein the clock tree comprises multiple layers, clock lines located in a same layer extending in a same oblique direction, and clock lines located in different layers being connected by via contacts.

3. A semiconductor integrated circuit comprising:
a phase-locked loop circuit located at a corner of a chip; and
a clock mesh covering the entire area of the chip, the clock mesh comprising oblique lines extending at an oblique angle with respect to an orthogonal coordinate axes of the chip.

4. The semiconductor integrated circuit of claim 3, wherein the oblique lines forming the clock mesh are located in a same layer.

5. A semiconductor integrated circuit comprising:
a clock mesh comprising oblique lines extending at an oblique angle with respect to an orthogonal coordinate axes of a chip;
a root driver for driving the entire clock mesh;
a main clock supply line extending from the root driver; and
a plurality of sub-drivers connected to the main clock supply line and for driving the oblique lines independently.

6. A semiconductor integrated circuit comprising:
a main phase-locked loop positioned near the periphery of a chip of the semiconductor integrated circuit;
a base-clock supply line extending from the main phase-locked loop and for supplying a base clock at a prescribed frequency;
a plurality of random blocks arranged in the chip, each block having a clock driver cell connected to the base-clock supply line and a clock tree comprising oblique lines, the clock driver cell converting the base clock into a higher frequency clock, and supplying the higher frequency clock to elements inside the associated block via the clock tree.

7. The semiconductor integrated circuit of claim 6, wherein the base-clock supply line extends across the chip in a direction parallel to an orthogonal coordinate axis of the chip.

8. The semiconductor integrated circuit of claim 7, further comprising random blocks, each block having a clock tree comprising orthogonal lines parallel to the orthogonal coordinate axes of the chip.

9. The semiconductor integrated circuit of claim 6, wherein the main phased-locked loop is positioned at a corner of the chip, and the base-clock supply line extends across the chip in a direction oblique with respect to the orthogonal coordinate axes of the chip.

10. The semiconductor integrated circuit of claim 9, further comprising random blocks, each block having a clock tree comprising orthogonal lines parallel to the orthogonal coordinate axes of the chip.

11. The semiconductor integrated circuit comprising:
a main phase-locked loop positioned near the periphery of a chip of a semiconductor integrated circuit;
a base-clock supply line extending from the main phase-locked loop and for supplying a base clock at a prescribed frequency;
a plurality of random blocks, each block having a clock driver cell connected to the base-clock supply line and a clock mesh comprising oblique lines extending at an oblique angle with respect to an orthogonal coordinate axes of the chip, said clock driver cell converting the base clock into a higher frequency clock and supplying the higher frequency clock to elements inside the block via the clock mesh.

12. The semiconductor integrated circuit of claim 11, further comprising random blocks, each block having a clock tree comprising orthogonal lines parallel to the orthogonal coordinate axes of the chip.

13. The semiconductor integrated circuit of claim 11, wherein the base-clock supply line extends across the chip in a direction parallel to the orthogonal coordinate axes of the chip.

14. The semiconductor integrated circuit of claim 11, wherein the main phase-locked loop is positioned at a corner of the chip, and the base-clock supply line extends across the chip in a direction oblique to the orthogonal coordinate axes of the chip.

15. An exposure mask set used to manufacture a semiconductor device, the mask set comprising:
a first mask having basic orthogonal line patterns;
a second mask having aperture patterns for via holes, the aperture patterns being aligned to the end portions of the orthogonal line patterns; and
a third mask having oblique line patterns extending at an oblique angle with respect to the orthogonal line pattern the oblique line patterns having end portions that are aligned to the end portions of the orthogonal line patterns of the first mask and the aperture patterns of the second mask.

16. A semiconductor integrated circuit comprising:
a first wiring layer including orthogonal line patterns with a first line width;
an insulating layer placed on the first wiring layer;
a second wiring layer placed on the insulating layer and including oblique line patterns with a second line width, the each line extending at an oblique angle with respect to the orthogonal line pattern of the first wiring layer, the end portions of the oblique line patterns being positioned directly above the end portions of the orthogonal line patterns of the first wiring layer; and
via contacts penetrating through the insulating layer and for connecting the end portions of orthogonal line patterns of the first wiring layer to the end portions of the oblique line patterns of the second wiring layer;
wherein the horizontal cross-section of each via contact is square, and is completely inside the end portion of a narrower line pattern either the oblique or the orthogonal line pattern.

17. The semiconductor integrated circuit of claim 16, wherein the end portions of the oblique line patterns of the second wiring layer are connected to the end portions of the orthogonal line patterns of the first wiring layer by the via contacts substantially without overhangs from the via contacts.

18. The semiconductor integrated circuit of claim 16, wherein the end portion of an orthogonal line of the first wiring layer is connected to the end portion of an oblique line of the second wiring layer by one or more via contacts, one of the via contacts being located at the intersection of the longitudinal center lines of the orthogonal line and the oblique line.

19. A method for manufacturing a semiconductor integrated circuit, comprising:
forming first metal lines extending in a proscribed direction on a semiconductor substrate;
forming an insulating layer over the first metal lines and the semiconductor substrate;
forming via holes penetrating through the insulating layer and reaching the end portions of the first metal lines, so that the bottom of each via hole is completely inside the associated first metal line;
filling the via holes with a conductive material to form contacts; and
forming second metal lines extending at an oblique angle with respect to the first metal lines, so that the end portions of the second metal lines completely cover the top faces of the contacts.

* * * * *